(12) United States Patent
Fujiwara et al.

(10) Patent No.: US 12,500,570 B2
(45) Date of Patent: Dec. 16, 2025

(54) SHEAR HORIZONTAL MODE ACOUSTIC WAVE DEVICE WITH MULTILAYER INTERDIGITAL TRANSDUCER ELECTRODE

(71) Applicant: Skyworks Solutions, Inc., Irvine, CA (US)

(72) Inventors: Joji Fujiwara, Suita (JP); Riho Sasaki, Hirakata (JP); Kyohei Kobayashi, Otsu (JP); Noriaki Amo, Sanda (JP); Yosuke Hamaoka, Suita (JP)

(73) Assignee: Skyworks Solutions, Inc., Irvine, CA (US)

( * ) Notice: Subject to any disclaimer, the term of this patent is extended or adjusted under 35 U.S.C. 154(b) by 559 days.

(21) Appl. No.: 17/936,237

(22) Filed: Sep. 28, 2022

(65) Prior Publication Data

US 2023/0094376 A1   Mar. 30, 2023

Related U.S. Application Data

(60) Provisional application No. 63/249,775, filed on Sep. 29, 2021, provisional application No. 63/249,781, filed on Sep. 29, 2021.

(51) Int. Cl.
   H03H 9/02   (2006.01)
   H03H 9/145  (2006.01)

(52) U.S. Cl.
   CPC .... H03H 9/02992 (2013.01); H03H 9/02559 (2013.01); H03H 9/02834 (2013.01); H03H 9/145 (2013.01)

(58) Field of Classification Search
   CPC .......... H03H 9/02992; H03H 9/02559; H03H 9/02834; H03H 9/145; H03H 9/14532; H03H 9/14541; H03H 9/1457
   USPC .................................................. 333/193–196
   See application file for complete search history.

(56) References Cited

U.S. PATENT DOCUMENTS

| | | |
|---|---|---|
| 8,427,259 B2 | 4/2013 | Fujiwara et al. |
| 8,436,778 B2 | 5/2013 | Fujiwara et al. |
| 8,476,991 B2 | 7/2013 | Goto et al. |
| 8,482,363 B2 | 7/2013 | Fujiwara et al. |
| 8,487,720 B2 | 7/2013 | Fujiwara et al. |
| 8,531,252 B2 | 9/2013 | Nakamura et al. |
| 8,531,254 B2 | 9/2013 | Yamaji et al. |
| 8,618,992 B2 | 12/2013 | Fujiwara et al. |

(Continued)

*Primary Examiner* — Jorge L Salazar, Jr.
(74) *Attorney, Agent, or Firm* — Knobbe, Martens, Olson & Bear, LLP

(57) ABSTRACT

An acoustic wave device is disclosed. The acoustic waved device can be a shear horizontal mode surface acoustic wave device. The acoustic wave device can include a piezoelectric layer, an interdigital transducer electrode over the piezoelectric layer, and a temperature compensation layer over the interdigital transducer electrode. The piezoelectric layer can be a lithium niobate layer with a cut angle in a range of −20° YX to 25° YX. The interdigital transducer electrode including a first layer and a second layer. The first layer affects acoustic properties of the acoustic wave device and the second layer affects electrical properties of the acoustic wave device. The second layer is positioned between the piezoelectric layer and the first layer such that a frequency response of the acoustic wave device includes a Rayleigh mode response at a frequency higher than a shear horizontal mode response.

20 Claims, 17 Drawing Sheets

(56) References Cited

U.S. PATENT DOCUMENTS

| | | |
|---|---|---|
| 8,669,832 B2 | 3/2014 | Kamiguchi et al. |
| 8,686,809 B2 | 4/2014 | Fujiwara et al. |
| 8,698,578 B2 | 4/2014 | Nakanishi et al. |
| 8,994,472 B2 | 3/2015 | Yamaji et al. |
| 9,065,424 B2 | 6/2015 | Nakanishi et al. |
| 9,083,314 B2 | 7/2015 | Tsurunari et al. |
| 9,136,458 B2 | 9/2015 | Komatsu et al. |
| 9,166,558 B2 | 10/2015 | Fujiwara et al. |
| 9,203,376 B2 | 12/2015 | Tsurunari et al. |
| 9,203,378 B2 | 12/2015 | Fujiwara et al. |
| 9,246,533 B2 | 1/2016 | Fujiwara et al. |
| 9,294,071 B2 | 3/2016 | Yamaji et al. |
| 9,419,584 B2 | 8/2016 | Tsurunari et al. |
| 9,425,766 B2 | 8/2016 | Fujiwara et al. |
| 9,467,117 B2 | 10/2016 | Fujiwara et al. |
| 9,473,107 B2 | 10/2016 | Komatsu et al. |
| 9,503,050 B2 | 11/2016 | Hamaoka et al. |
| 9,520,857 B2 | 12/2016 | Fujiwara et al. |
| 9,614,495 B2 | 4/2017 | Hamaoka et al. |
| 9,628,047 B2 | 4/2017 | Miyanari et al. |
| 9,640,750 B2 | 5/2017 | Nakanishi et al. |
| 9,722,573 B2 | 8/2017 | Fujiwara et al. |
| 9,722,576 B2 | 8/2017 | Fujiwara et al. |
| 9,748,924 B2 | 8/2017 | Komatsu et al. |
| 9,819,329 B2 | 11/2017 | Tsurunari et al. |
| 10,044,340 B2 | 8/2018 | Fujiwara et al. |
| 10,075,146 B2 | 9/2018 | Hamaoka et al. |
| 10,097,159 B2 | 10/2018 | Komatsu et al. |
| 10,135,422 B2 | 11/2018 | Goto et al. |
| 10,141,643 B2 | 11/2018 | Fujiwara et al. |
| 10,187,039 B2 | 1/2019 | Komatsu et al. |
| 10,284,171 B2 | 5/2019 | Miyanari et al. |
| 10,389,326 B2 | 8/2019 | Hamaoka et al. |
| 10,491,194 B2 | 11/2019 | Komatsu et al. |
| 10,979,028 B2 | 4/2021 | Komatsu et al. |
| 11,050,406 B2 | 6/2021 | Maki et al. |
| 11,082,029 B2 | 8/2021 | Kodama et al. |
| 11,444,599 B2 | 9/2022 | Sasaki et al. |
| 11,581,869 B2 | 2/2023 | Shin et al. |
| 11,652,466 B2 | 5/2023 | Fujiwara |
| 11,677,380 B2 | 6/2023 | Fujiwara et al. |
| 11,799,445 B2 | 10/2023 | Kodama et al. |
| 11,923,829 B2 | 3/2024 | Komatsu et al. |
| 12,021,506 B2 | 6/2024 | Shin et al. |
| 12,047,053 B2 | 7/2024 | Maki et al. |
| 2016/0226464 A1 | 8/2016 | Fujiwara et al. |
| 2019/0074819 A1 | 3/2019 | Goto et al. |
| 2020/0366268 A1* | 11/2020 | Goto ............... H03H 9/02574 |
| 2022/0103152 A1 | 3/2022 | Shin et al. |
| 2022/0103159 A1 | 3/2022 | Shin et al. |
| 2022/0345103 A1 | 10/2022 | Guo et al. |
| 2022/0407496 A1 | 12/2022 | Hill et al. |
| 2023/0026465 A1 | 1/2023 | Huang et al. |
| 2023/0028925 A1 | 1/2023 | Kobayashi |
| 2023/0043197 A1 | 2/2023 | Fujiwara et al. |
| 2023/0048476 A1 | 2/2023 | Cheng et al. |
| 2023/0094376 A1 | 3/2023 | Fujiwara et al. |
| 2023/0101360 A1 | 3/2023 | Fujiwara et al. |
| 2023/0216219 A1 | 7/2023 | Ochiai et al. |
| 2023/0283261 A1 | 9/2023 | Huang et al. |
| 2023/0336159 A1 | 10/2023 | Hiramatsu et al. |
| 2024/0056049 A1 | 2/2024 | Yamamura et al. |
| 2024/0250435 A1 | 7/2024 | Fujiwara et al. |
| 2024/0258994 A1 | 8/2024 | Steiner et al. |

* cited by examiner

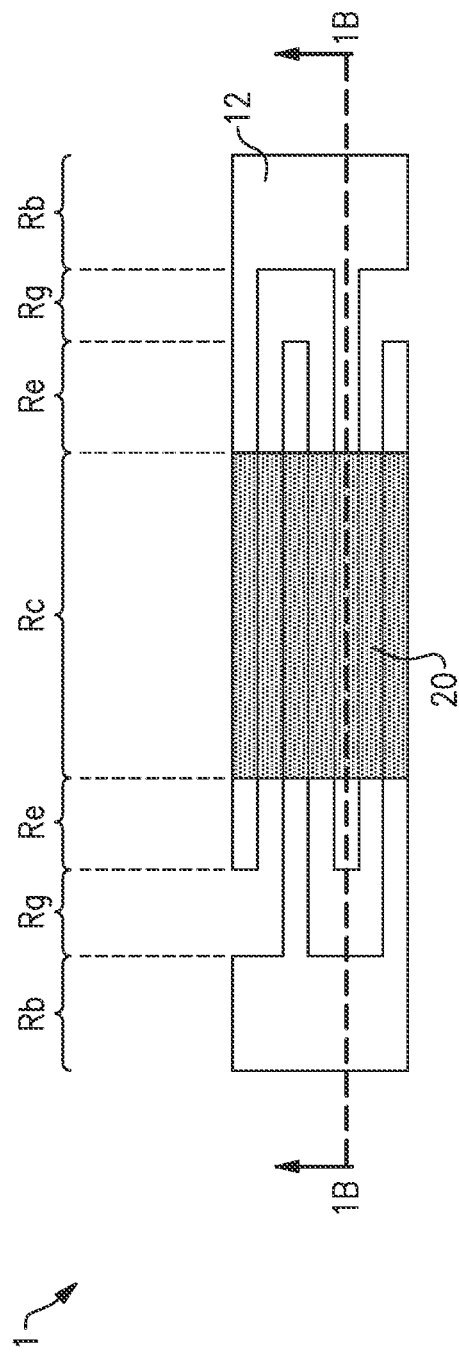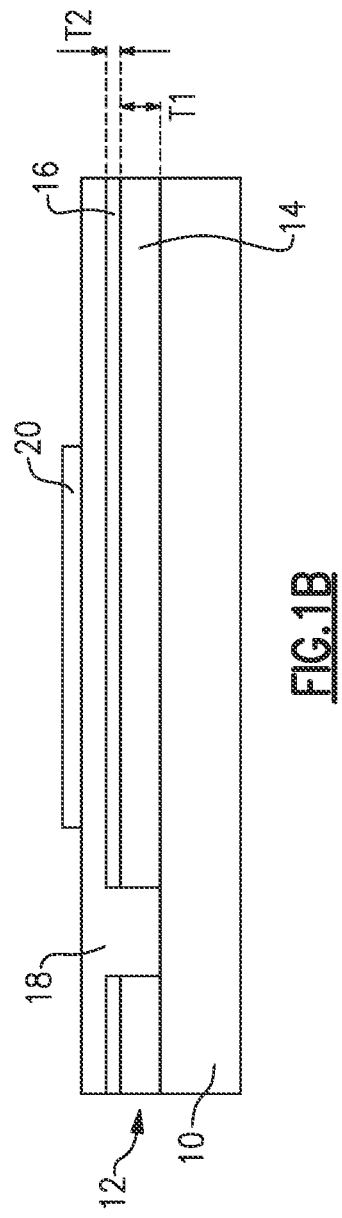
FIG.1A
FIG.1B

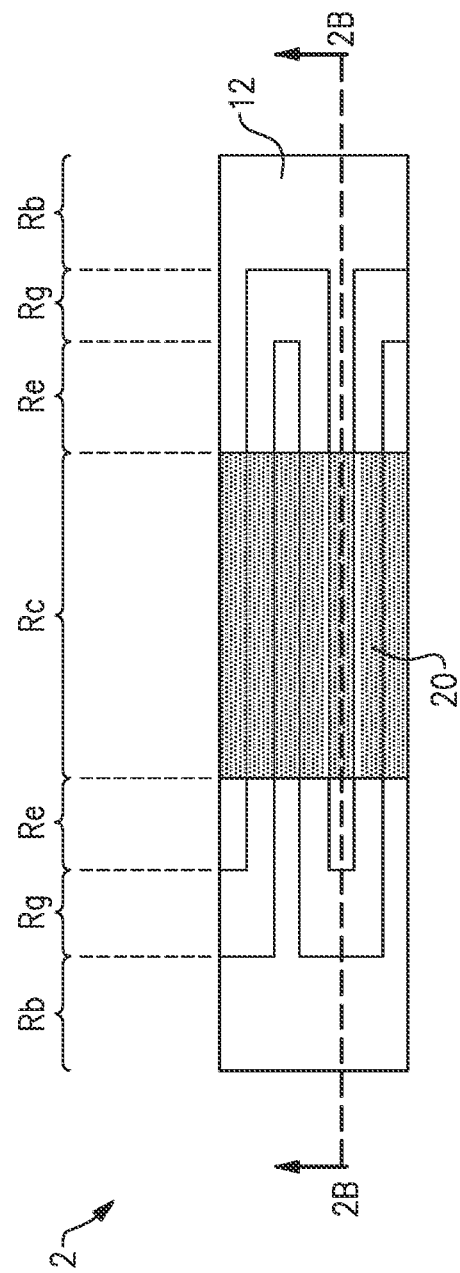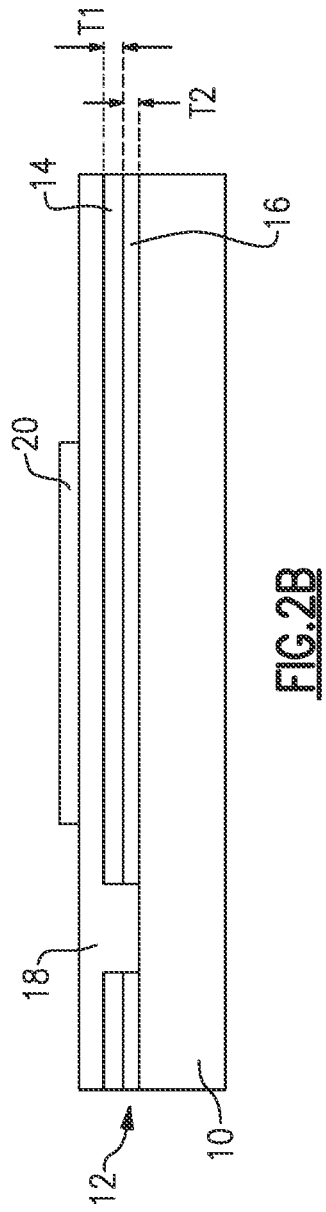
FIG. 2A
FIG. 2B

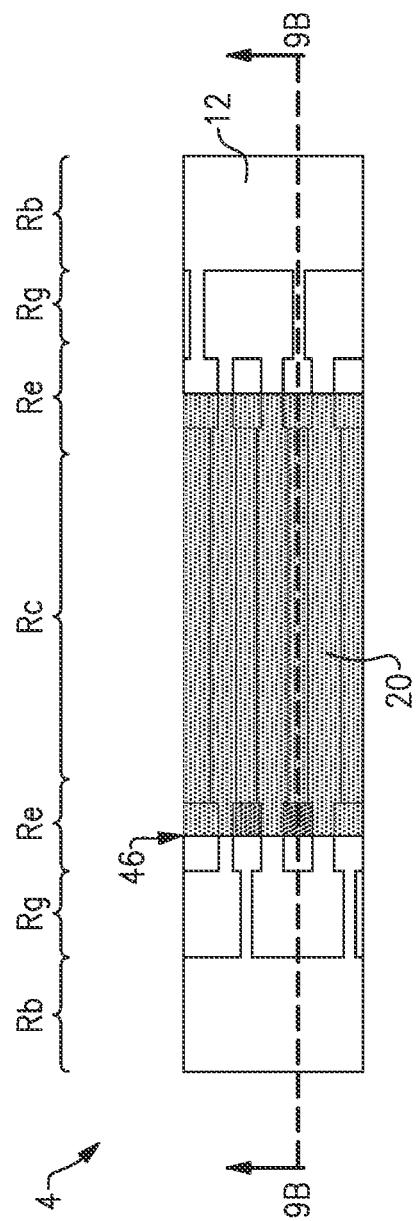
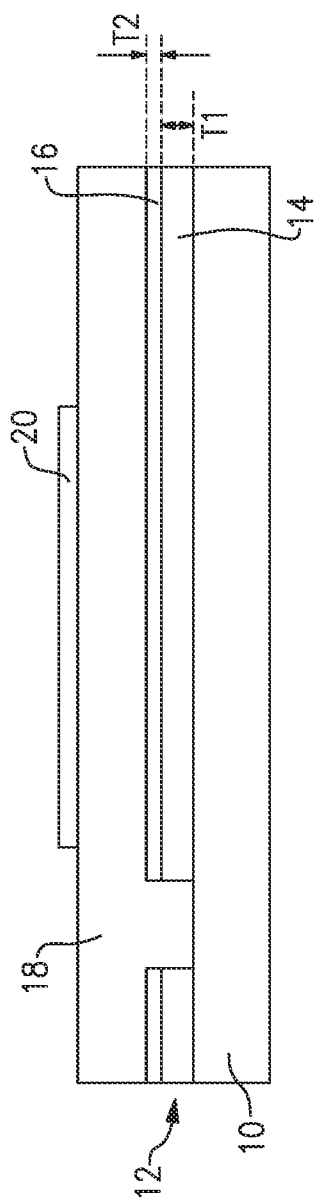
FIG.9A
FIG.9B

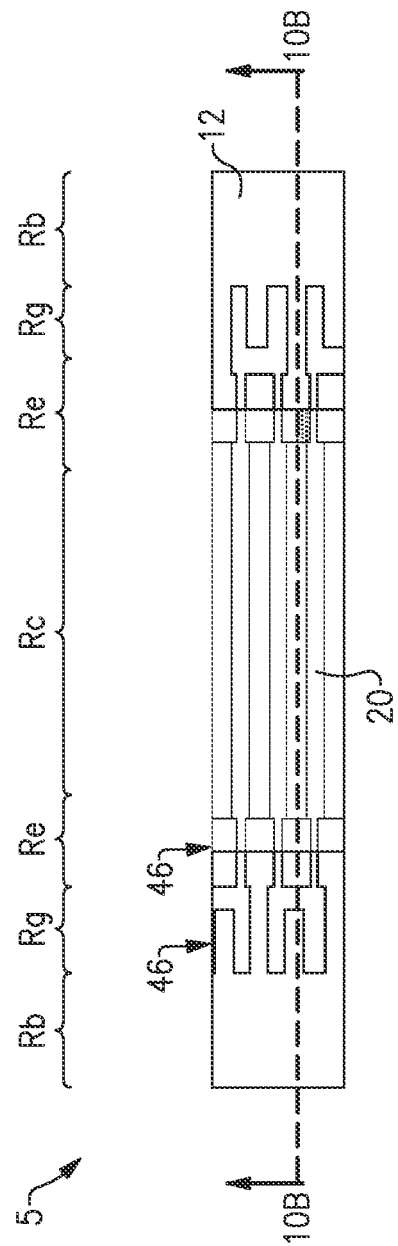
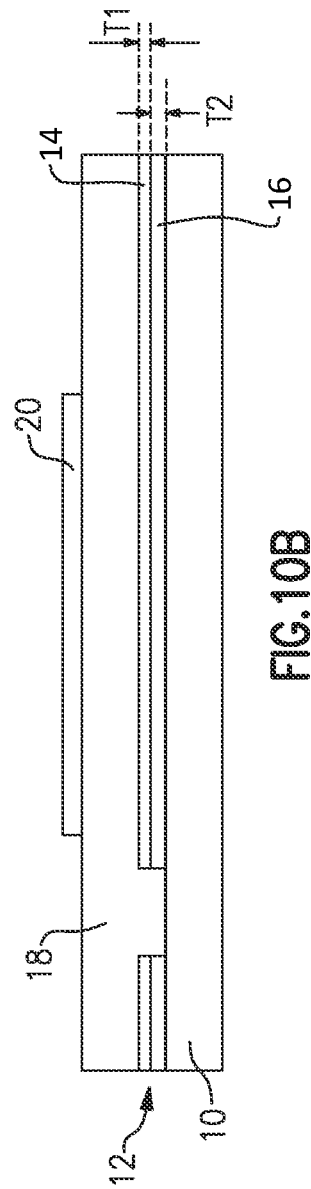

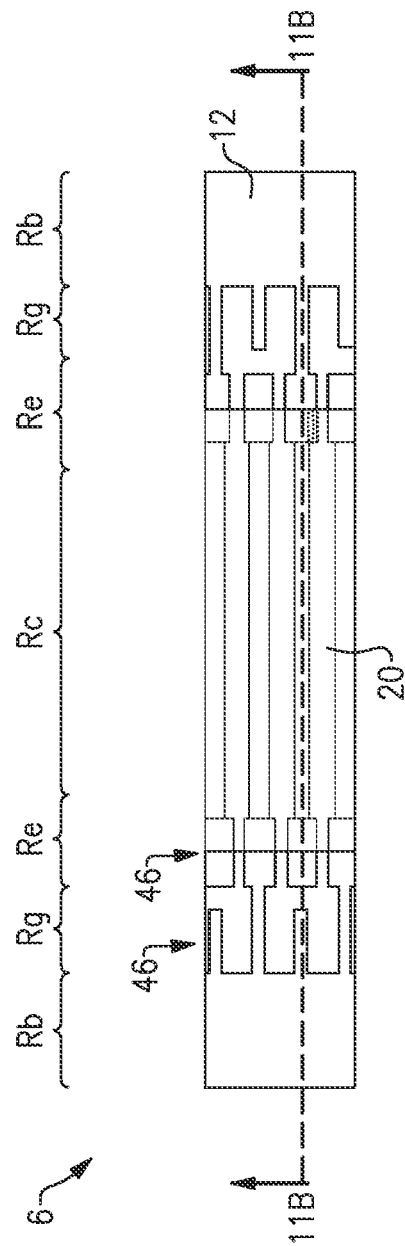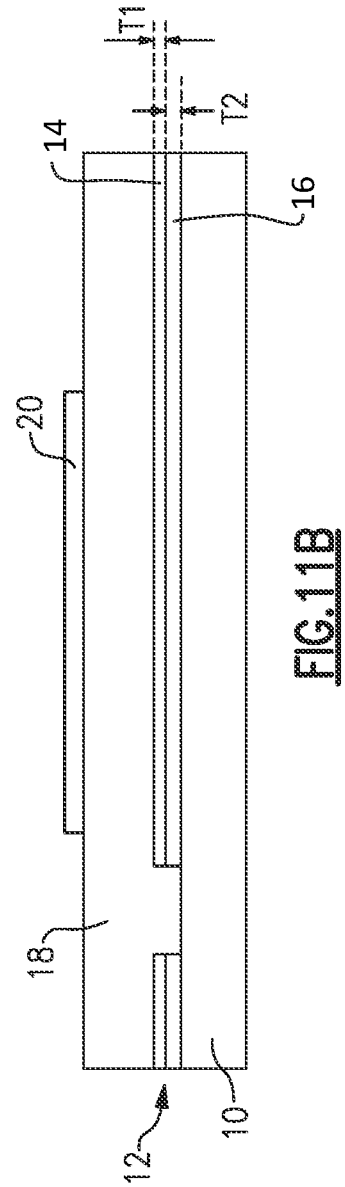
FIG.11A
FIG.11B

SHEAR HORIZONTAL MODE ACOUSTIC WAVE DEVICE WITH MULTILAYER INTERDIGITAL TRANSDUCER ELECTRODE

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/249,775, filed Sep. 29, 2021, titled "ACOUSTIC WAVE DEVICE WITH MULTILAYER INTERDIGITAL TRANSDUCER ELECTRODE," and U.S. Provisional Patent Application No. 63/249,781, filed Sep. 29, 2021, titled "SHEAR HORIZONTAL MODE ACOUSTIC WAVE DEVICE WITH MULTILAYER INTERDIGITAL TRANSDUCER ELECTRODE," are hereby incorporated by reference under 37 CFR 1.57 in their entirety.

BACKGROUND

Technical Field

Embodiments of this disclosure relate to acoustic wave devices.

Description of Related Technology

A surface acoustic wave filter can include a plurality of surface acoustic wave resonators arranged to filter a radio frequency signal. Each resonator can include a surface acoustic wave device. Example surface acoustic wave device include temperature compensated surface acoustic wave device. A surface acoustic wave device can be configured to generate, for example, a Rayleigh mode surface acoustic wave in which the main mode of the acoustic wave generated by the surface acoustic wave device is Rayleigh mode, or a shear horizontal mode surface acoustic wave in which the main mode of the acoustic wave generated by the surface acoustic wave device is shear horizontal mode.

Surface acoustic wave filters can be implemented in radio frequency electronic systems. For instance, filters in a radio frequency front end of a mobile phone can include surface acoustic wave filters. A plurality of acoustic wave filters can be arranged as a multiplexer. For example, two surface acoustic wave filters can be arranged as a duplexer. Transverse leakage generally degrades the performance of the surface acoustic wave device.

SUMMARY

The innovations described in the claims each have several aspects, no single one of which is solely responsible for its desirable attributes. Without limiting the scope of the claims, some prominent features of this disclosure will now be briefly described.

In one aspect, an acoustic wave device is disclosed. The acoustic wave device can include a piezoelectric layer that is configured such that a shear horizontal mode is a main mode of the acoustic wave device. The acoustic wave device can include an interdigital transducer electrode over the piezoelectric layer. The interdigital transducer electrode includes a first layer having a first thickness and a second layer having a second thickness. The first layer affects acoustic properties of the acoustic wave device and the second layer affects electrical properties of the acoustic wave device. The first layer is positioned between the piezoelectric layer and the second layer. The first thickness is configured such that a frequency response of the acoustic wave device includes a Rayleigh mode response at a frequency higher than a shear horizontal mode response resonance. The acoustic wave device can include a temperature compensation layer over the interdigital transducer electrode.

In one embodiment, the interdigital transducer electrode is configured such that the frequency response includes the Rayleigh mode response between a shear horizontal mode response resonance and a shear horizontal mode response anti-resonance.

In one embodiment, interdigital transducer electrode is configured to suppress transverse leakage of a surface acoustic wave generated by the acoustic wave device.

In one embodiment, the first layer includes tungsten, molybdenum, platinum, iridium, gold, or copper, and the second layer includes aluminum.

In one embodiment, the first thickness is greater than the second thickness.

In one embodiment, the acoustic wave device is configured to generate a surface acoustic wave having a wavelength k, the first thickness is in a range of 0.02λ to 0.1λ.

In one embodiment, the interdigital transducer electrode further includes a third layer between the piezoelectric layer and the first layer. The third layer can be a titanium adhesion layer.

In one embodiment, the temperature compensation layer is a silicon dioxide layer.

In one embodiment, the acoustic wave device further includes a silicon nitride layer over the temperature compensation layer. The interdigital transducer electrode can include a bus bar region, an active region that includes a center region and an edge region, and a gap region between the bus bar region and the edge region, the silicon nitride layer is disposed over the center region of the interdigital transducer electrode. The silicon nitride layer can be disposed over at least a portion of the edge region of the interdigital transducer electrode, and portions of the temperature compensation layer over the edge region and the bus bar region can be uncovered by the silicon nitride layer.

In one embodiment, the interdigital transducer electrode further includes a hammer head structure.

In one embodiment, the interdigital transducer electrode further includes a dummy finger disposed in a gap region between a bus bar and an active region. A width of a finger of the interdigital transducer electrode in the gap region and a width of the dummy finger can be narrower than a width of the finger in the active region.

In one embodiment, the piezoelectric layer is a lithium niobate layer having a cut angle in a range of −20° YX to 25° YX.

In one aspect, a shear horizontal acoustic wave device is disclosed. The shear horizontal acoustic wave device can include a piezoelectric layer having a cut angle in a range of −20° YX to 25° YX. The acoustic wave device can include an interdigital transducer electrode over the piezoelectric layer. The interdigital transducer electrode includes a first layer having a first thickness and a second layer having a second thickness. A material of the first layer is more dense than a material of the second layer The first layer is positioned between the piezoelectric layer and the second layer. The first thickness is greater than the second thickness. The shear horizontal acoustic wave device can include a temperature compensation layer over the interdigital transducer electrode.

In one embodiment, the piezoelectric layer is a lithium niobate layer and configured such that a shear horizontal mode is a main mode of the acoustic wave device. The first thickness can be configured such that a frequency response of the acoustic wave device includes a Rayleigh mode response at a frequency higher than a shear horizontal mode response resonance.

In one aspect, an acoustic wave device is disclosed. The acoustic wave device can include a lithium niobate piezoelectric layer having a cut angle in a range of −20° YX to 25° YX such that a shear horizontal mode is a main mode of the acoustic wave device. The acoustic wave device can include an interdigital transducer electrode over the piezoelectric layer. The interdigital transducer electrode includes a tungsten layer having a first thickness and an aluminum layer having a second thickness. The tungsten layer is positioned between the lithium niobate piezoelectric layer and the aluminum layer. The first thickness is configured such that a frequency response of the acoustic wave device includes a Rayleigh mode response at a frequency higher than a shear horizontal mode response. The acoustic wave device can include a temperature compensation layer over the interdigital transducer electrode.

In one embodiment, the acoustic wave device is configured to generate a surface acoustic wave having a wavelength $\lambda$, and the first thickness is at least $0.06\lambda$.

In one aspect, an acoustic wave device is disclosed. The acoustic wave device can include a piezoelectric layer that is configured such that a shear horizontal mode is a main mode of the acoustic wave device. The acoustic wave device can include an interdigital transducer electrode over the piezoelectric layer. The interdigital transducer electrode includes a first layer and a second layer. The first layer affects acoustic properties of the acoustic wave device and the second layer affects electrical properties of the acoustic wave device. The second layer is positioned between the piezoelectric layer and the first layer such that a frequency response of the acoustic wave device includes a Rayleigh mode response at a frequency higher than a shear horizontal mode response. The acoustic wave device can include a temperature compensation layer over the interdigital transducer electrode.

In one embodiment, the interdigital transducer electrode is configured such that the frequency response includes the Rayleigh mode response between a shear horizontal mode response resonance and a shear horizontal mode response anti-resonance.

In one embodiment, the interdigital transducer electrode is configured to suppress transverse leakage of a surface acoustic wave generated by the acoustic wave device.

In one embodiment, wherein the first layer includes tungsten, molybdenum, platinum, iridium, gold, or copper, and the second layer includes aluminum.

In one embodiment, a first thickness of the first layer is greater than a second thickness of the second layer. The acoustic wave device can be configured to generate a surface acoustic wave having a wavelength $\lambda$, and the first thickness can be in a range of $0.02\lambda$ to $0.1\lambda$.

In one embodiment, the interdigital transducer electrode further includes a third layer between the piezoelectric layer and the first layer. The layer can be a titanium adhesion layer.

In one embodiment, the temperature compensation layer is a silicon dioxide layer.

In one embodiment, the acoustic wave device further includes a silicon nitride layer over the temperature compensation layer. The interdigital transducer electrode can include a bus bar region, an active region that includes a center region and an edge region, and a gap region between the bus bar region and the edge region, the silicon nitride layer is disposed over the center region of the interdigital transducer electrode and at least a portion of the edge region of the interdigital transducer electrode. Portions of the temperature compensation layer over the edge region and the bus bar region can be uncovered by the silicon nitride layer.

In one embodiment, the acoustic wave device further includes a piston mode structure that is configured to suppress a transverse mode of an acoustic wave generated by the acoustic wave device. The interdigital transducer electrode includes a hammer head structure.

In one embodiment, the interdigital transducer electrode further includes a dummy finger disposed in a gap region between a bus bar and an active region. A width of a finger of the interdigital transducer electrode in the gap region and a width of the dummy finger can be narrower than a width of the finger in the active region.

In one embodiment, the piezoelectric layer is a lithium niobate layer having a cut angle in a range of −20° YX to 25° YX.

In one aspect, a shear horizontal acoustic wave device is disclosed. The shear horizontal acoustic wave device can include a piezoelectric layer having a cut angle in a range of −20° YX to 25° YX. The shear horizontal acoustic wave device can include an interdigital transducer electrode over the piezoelectric layer. The interdigital transducer electrode includes a first layer having a first density and a second layer having a second density. The first density is greater than the second density. The second layer positioned between the piezoelectric layer and the first layer such that a frequency response of the acoustic wave device includes a Rayleigh mode response at a frequency higher than a shear horizontal mode response. The shear horizontal acoustic wave device can include a temperature compensation layer over the interdigital transducer electrode.

In one embodiment, the piezoelectric layer is a lithium niobate layer and configured such that a shear horizontal mode is a main mode of the acoustic wave device. Materials of the first layer and the second layer can be configured such that a frequency response of the acoustic wave device includes a Rayleigh mode response at a frequency higher than a shear horizontal mode response resonance.

In one aspect, an acoustic wave device is disclosed. The acoustic wave device can include a lithium niobate piezoelectric layer having a cut angle in a range of −20° YX to 25° YX such that a shear horizontal mode is a main mode of the acoustic wave device. The acoustic wave device can include an interdigital transducer electrode over the piezoelectric layer. The interdigital transducer electrode includes a tungsten layer and an aluminum layer. The aluminum layer is positioned between the lithium niobate piezoelectric layer and the tungsten layer such that a frequency response of the acoustic wave device includes a Rayleigh mode response at a frequency higher than a shear horizontal mode response. The acoustic wave device can include a temperature compensation layer over the interdigital transducer electrode.

In one embodiment, the acoustic wave device is configured to generate a surface acoustic wave having a wavelength $\lambda$, and a thickness of the tungsten layer is in a range of $0.02\lambda$ to $0.1\lambda$.

In one aspect, an acoustic wave device is disclosed. The acoustic wave device can include a piezoelectric layer, an interdigital transducer electrode over the piezoelectric layer, and a temperature compensation layer over the interdigital transducer electrode. The interdigital transducer electrode includes a first layer having a first density and a second layer having a second density. The first density is greater than the second density. The second layer is positioned between the piezoelectric layer and the first layer.

In one embodiment, the piezoelectric layer is a lithium niobate layer that has a cut angle in a range of −20° YX to 25° YX.

In one embodiment, the interdigital transducer electrode is configured such that a frequency response of the acoustic wave device includes a Rayleigh mode response at a frequency higher than a shear horizontal mode response.

In one embodiment, the piezoelectric layer is configured such that a shear horizontal mode is a main mode of the acoustic wave device, and materials of the first layer and the second layer are configured such that a frequency response of the acoustic wave device includes a Rayleigh mode response at a frequency higher than a shear horizontal mode response resonance. The first layer can be a tungsten layer and the second layer can be an aluminum layer.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/936,281, titled "ACOUSTIC WAVE DEVICE WITH MULTILAYER INTERDIGITAL TRANSDUCER ELECTRODE," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 1A a schematic top plan view of an acoustic wave device according to an embodiment.

FIG. 1B is a schematic cross-sectional side view of the surface acoustic wave device of FIG. 1A.

FIG. 2A a schematic top plan view of an acoustic wave device according to another embodiment.

FIG. 2B is a schematic cross-sectional side view of the surface acoustic wave device of FIG. 2A.

FIG. 9A is a schematic top plan view of an acoustic wave device according to another embodiment.

FIG. 9B is a schematic cross-sectional side view of the surface acoustic wave device of FIG. 9A.

FIG. 10A is a schematic top plan view of an acoustic wave device according to another embodiment.

FIG. 10B is a schematic cross-sectional side view of the surface acoustic wave device of FIG. 10A.

FIG. 11A is a schematic top plan view of an acoustic wave device according to another embodiment.

FIG. 11B is a schematic cross-sectional side view of the surface acoustic wave device of FIG. 10A.

DETAILED DESCRIPTION OF CERTAIN EMBODIMENTS

Figure 3A:
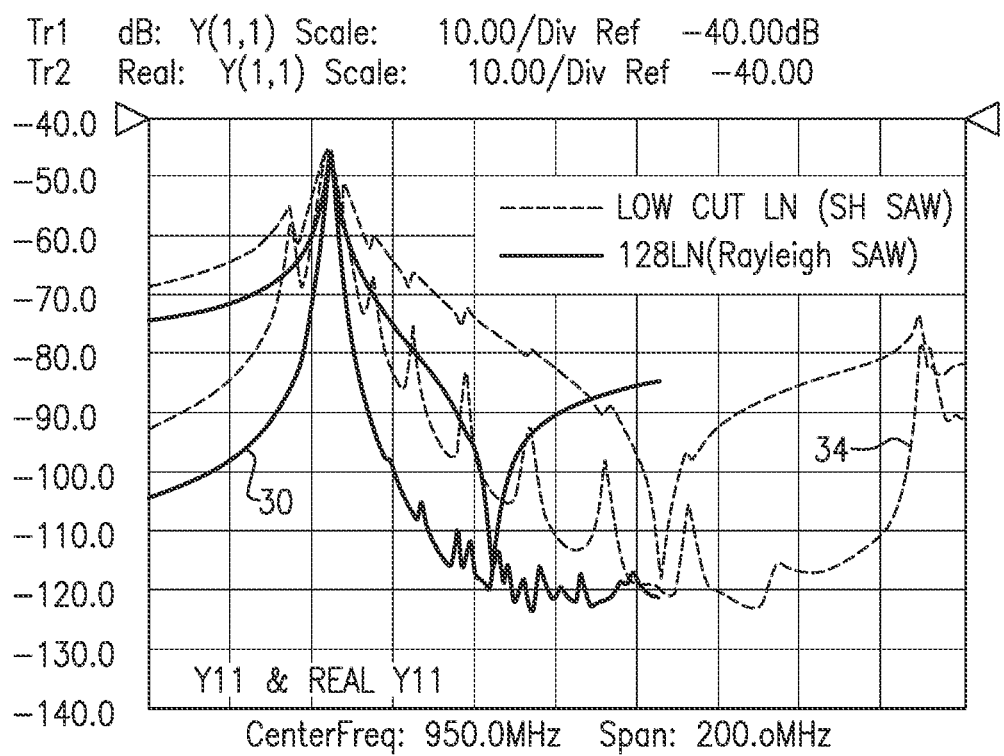
FIGS. 3A and 3B graphs showing simulated frequency responses of two different surface acoustic wave devices.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. The surface acoustic wave devices include SAW resonators, SAW delay lines, and multi-mode SAW (MMS) filters (e.g., double mode SAW (DMS) filters).

In general, high quality factor (Q), large effective electromechanical coupling coefficient or coupling factor ($K^2$), high frequency ability, and spurious free can be significant aspects for micro resonators to enable low-loss filters, stable oscillators, and sensitive sensors. With a relatively low cut angle lithium niobate piezoelectric layer, the main mode of a surface acoustic wave device can be a shear horizontal mode. A surface acoustic wave device having a relatively low cut angle lithium niobate (LN or LiNbO₃) for its piezoelectric layer can achieve relatively large effective electromechanical coupling coefficient as compared to LN with a 128° rotated Y-cut, X-propagating cut angle (128° YX-LN). For example, the low cut angle lithium niobate layer can have a cut angle in a range from −20° to 25° rotated Y-cut, X-propagating (−20° to 25° YX-LN). However, the quality factor may be degraded in such a surface acoustic wave device with a relatively low cut angle LN.

Various embodiments disclosed herein relate to acoustic wave devices with a relatively large effective electromechanical coupling coefficient and a relatively high quality factor. An acoustic wave device according to various embodiments disclosed herein can be, for example, a temperature compensated shear horizontal mode acoustic wave device. The acoustic wave device can include a piezoelectric layer, an interdigital transducer electrode over the piezoelectric layer, and a temperature compensation layer over the interdigital transducer electrode. The piezoelectric layer can be a low cut lithium niobate piezoelectric layer, such as a lithium niobate layer that is in a 0° YX-LN group. The 0° YX-LN group can include a lithium niobate with a cut angle in a range from, for example, −20° to 25° rotated Y-cut, X-propagating (−20° to 25° YX-LN). The 0° YX-LN group can also include a lithium niobate layer with a cut angle in Euler angle (φ, θ, ψ) of −15<φ<15, 90-20<θ<90+25, −15<ψ<15. The interdigital transducer electrode can be a multilayer interdigital transducer electrode. For example, the interdigital transducer electrode can be a dual-layer interdigital transducer electrode that includes a first layer and a second layer. The first layer and the second layer can include different materials. For example, the first layer can be more dense than the second layer, the first layer can affect acoustic properties of the acoustic wave device and the second layer affects electrical properties of the acoustic wave device, or the first layer can be a tungsten layer and the second layer can be an aluminum layer. In some embodiments, the first layer can be disposed between the piezoelectric layer and the second layer, and a thickness of the first layer can be configured such that a frequency response of the acoustic wave device includes a Rayleigh mode response at a frequency higher than a shear horizontal mode response. In some embodiments, the first layer can be disposed between the piezoelectric layer and the second layer, and the thickness of the first layer is greater than a thickness of the second layer. In some embodiments, the second layer can be disposed between the piezoelectric layer and the first layer.

FIG. 1A a schematic top plan view of an acoustic wave device 1 according to an embodiment. FIG. 1B is a schematic cross-sectional side view of the surface acoustic wave device 1 of FIG. 1A. In some embodiments, the acoustic wave device 1 can be a temperature compensated surface acoustic wave device. In some embodiments, the acoustic wave device 1 can be a temperature compensated shear horizontal mode acoustic wave device. The acoustic wave device 1 can include a piezoelectric layer 10 and an interdigital transducer electrode 12 over the piezoelectric layer 10. The interdigital transducer electrode 12 can have a first layer 14 and a second layer 16 over the first layer. The acoustic wave device 1 can include a temperature compensation layer 18 over the interdigital transducer electrode 12. The acoustic wave device 1 can include a dispersion adjustment layer 20 over the temperature compensation layer 18. The piezoelectric layer 10 and the temperature compensation layer 18 are hidden in FIG. 1A.

The piezoelectric layer 10 can be a low cut lithium niobate piezoelectric layer, such as a lithium niobate layer that is in a 0° YX-LN group. The 0° YX-LN group can include a lithium niobate layer with a cut angle in a range from, for example, −20° to 25° rotated Y-cut, X-propagating (−20° to 25° YX-LN). The 0° YX-LN group can also include a lithium niobate layer with a cut angle in Euler angle (φ, θ, ψ) of −15<φ<15, 90-20<θ<90+25, −15<ψ<15. For example, the piezoelectric layer 10 can be a lithium niobate layer with a cut angle in a range from, for example, −15° to 15° rotated Y-cut, X-propagating (−15° to 15° YX-LN). In some embodiments, the piezoelectric layer 10 can be a low cut lithium niobate piezoelectric layer such that the main mode of the acoustic wave device 1 is a shear horizontal mode. The piezoelectric layer 10 can be in a 128° YX-LN group. The 128° YX-LN group can include a lithium niobate layer with a cut angle in a range from, for example, 115° to 135° rotated Y-cut, X-propagating (115° to 135° YX-LN). 115° to 135° YX-LN can be expressed in Euler angle (φ, θ, ψ) as φ=0, 90+115<θ<90+135, ψ=0. The 128° YX-LN group can also include a lithium niobate layer with a cut angle in Euler angle (φ, θ, ψ) of −15<φ<15, 90+115<θ<90+135, −15<ψ<15. A skilled artisan will understand that a configuration of a piezoelectric layer that provides a shear horizontal mode as a main mode of the acoustic wave device is a structural feature of the piezoelectric layer.

The interdigital transducer electrode 12 is a multilayer interdigital transducer electrode. The interdigital transducer electrode 12 is a dual-layer interdigital transducer electrode that includes a first layer 14 and a second layer 16. The first layer 14 and the second layer 16 can include different materials. For example, the first layer 14 can be more dense than the second layer 16, the first layer 14 can affect acoustic properties of the acoustic wave device and the second layer 16 can affect electrical properties of the acoustic wave device 1, and/or the first layer 14 can be a tungsten layer and the second layer 16 can be an aluminum layer. In some embodiments, the first layer 14 can be disposed between the piezoelectric layer 10 and the second layer 16, and a thickness T1 of the first layer 14 can be configured such that a frequency response of the acoustic wave device 1 includes a Rayleigh mode response at a frequency higher than a shear horizontal mode response. In some embodiments, the first layer 14 can be disposed between the piezoelectric layer 10 and the second layer 16, and the thickness T1 of the first layer 14 can be greater than a thickness T2 of the second layer 16. A skilled artisan will understand that a configuration of the interdigital transducer electrode 12 that enable the acoustic wave device 1 to have a frequency response that includes a Rayleigh mode response at a frequency higher than a shear horizontal mode response is a structural feature.

The interdigital transducer electrode 12 can include any suitable material. For example, the interdigital transducer electrode 12 can include one or more of an aluminum (Al) layer, a molybdenum (Mo) layer, a tungsten (W) layer, a titanium (Ti) layer, a platinum (Pt) layer, a gold (Au) layer, a silver (Ag) layer, a copper (Cu) layer, a Magnesium (Mg) layer, a ruthenium (Ru) layer, or the like. The interdigital transducer electrode 12 may include alloys, such as AlMgCu, AlCu, etc. For example, the first layer 14 can be a molybdenum (Mo) layer, a tungsten (W) layer, a titanium (Ti) layer, a platinum (Pt) layer, a gold (Au) layer, a silver (Ag) layer, a copper (Cu) layer, a Magnesium (Mg) layer, or a ruthenium (Ru) layer. In some embodiments, the first layer 14 can include a material that has a density greater than 2.7 g/cm³, 4.5 g/cm³, 7 g/cm³, 10 g/cm³, or 15 g/cm³. For example, the second layer 16 can be an aluminum (Al) layer, and/or a conductive material that has a density less than the density of the first layer 14.

The thickness T1 of the first layer 14 can be determined based on the density of the material of the first layer 14. In some embodiments, when the first layer 14 includes a material that has a density about 19.3 g/cm$^3$, such as tungsten (W), the thickness T1 can be in in a range of 0.02λ to 0.1λ, 0.05λ to 0.1λ, 0.02λ to 0.75λ, or 0.05λ to 0.75λ. In some embodiments, when the first layer 14 is a tungsten layer and the second layer 16 is an aluminum layer, the thickness T1 can be at least 0.3 times greater than the thickness T2. For example, the thickness T1 can be 30% to 100%, 30% to 50%, 45% to 100%, or 45% to 75% greater than the thickness T2.

The interdigital transducer electrode 12 has a bus bar and fingers that extend from the bus bar. The interdigital transducer electrode 12 has a bus bar region Rb, an active region that includes a center region Rc and an edge region Re, and a gap region Rg between the bus bar region Rb and the edge region Re.

In some embodiments, the interdigital transducer electrode 12 can include a third layer (not illustrated). For example, the third layer can be an adhesion layer that is disposed between the piezoelectric layer 10 and the first layer 14. The adhesion layer can be a titanium layer. In some embodiments, the third layer may be provided between the first layer 14 and the second layer 16, or over the second layer 16.

The temperature compensation layer 18 can include any suitable temperature compensation material. For example, the temperature compensation layer 18 can be a silicon dioxide (SiO$_2$) layer. The temperature compensation layer 18 can be a layer of any other suitable material having a positive temperature coefficient of frequency (TCF) in instances where the piezoelectric layer 10 has a negative temperature coefficient of frequency. For instance, the temperature compensation layer 18 can be a tellurium dioxide (TeO$_2$) layer or a silicon oxyfluoride (SiOF) layer in certain applications. The temperature compensation layer 18 can include any suitable combination of SiO$_2$, TeO$_2$, and/or SiOF. The temperature compensation layer 18 can bring the TCF of the acoustic wave device 1 closer to zero to thereby provide temperature compensation. The temperature compensation layer 18 can improve the electromechanical coupling coefficient K$^2$ of the acoustic wave device 1 relative to a similar acoustic wave device without the temperature compensation layer 18. This advantage of the temperature compensation layer 18 can be more pronounced when the piezoelectric layer 10 includes an LN layer.

The dispersion adjustment layer 20 can be positioned over the center region Rc of the interdigital transducer electrode 12, in some embodiments. In some other embodiments, the dispersion adjustment layer 20 can be disposed entirely over an upper surface of the temperature compensation layer 18. The dispersion adjustment layer 20 can cause a magnitude of the velocity in the underlying region of the acoustic wave device 1 to be increased. The portions uncovered by or free from the dispersion adjustment layer 20 can reduce velocity in the underlying region of the acoustic wave device 1 relative to regions covered by the dispersion adjustment layer 20 to thereby suppress transverse modes. The dispersion adjustment layer 20 can include a silicon nitride (SiN) layer. In certain applications, the dispersion adjustment layer 20 can include any suitable material to increase the magnitude of the velocity of the underlying region of the acoustic wave device 1. According to some applications, the dispersion adjustment layer 20 can include SiN and/or another material. The dispersion adjustment layer 20 can have a thickness in a range from 0.001 L to 0.05 L.

The following table (Table 1) shows an example selection of various parameters of the acoustic wave device 1 that has an low cut lithium niobate LN layer as the piezoelectric layer 10, a tungsten (W) layer as the first layer 14, an aluminum (Al) layer as the second layer 16, a silicon dioxide (SiO$_2$) layer as the temperature compensation layer 18, and a silicon nitride (SiN) layer as the dispersion adjustment layer 20.

TABLE 1

|  | Label | Unit | Parameter |
| --- | --- | --- | --- |
| LN Cut Angle | Ang | deg. | 9 |
| Lambda | L | um | 4.0 |
| Aperture | Ap | λ | 20 |
| Center Region Dissipation Factor | DFc | — | 0.50 |
| Edge Region Dissipation Factor | DFe | — | 0.50 |
| Gap Region Dissipation Factor | DFg | — | 0.25 |
| W thickness (T1) | Wt | λ | 0.06 |
| Al thickness (T2) | Alt | λ | 0.06 |
| SiO2 thickness | SiO2t | λ | 0.15 |
| SiN thickness | SiNt | λ | 0.007 |
| SiN etching | SiNe | λ | 0.007 |
| SiN Edge Length | Les | λ | 0.75 |
| Gap Length | Lg | λ | 1.5 |

FIG. 2A a schematic top plan view of an acoustic wave device 2 according to an embodiment. FIG. 2B is a schematic cross-sectional side view of the surface acoustic wave device 2 of FIG. 2A. The acoustic wave device 2 can be generally similar to the acoustic wave device 1 illustrated in FIGS. 1A and 1B. Unless otherwise noted, the components of FIGS. 2A and 2B may be similar to or the same as like components disclosed herein, such as those of FIGS. 1A and 1B.

The acoustic wave device 2 can include a piezoelectric layer 10 and an interdigital transducer electrode 12 over the piezoelectric layer 10. The interdigital transducer electrode 12 can have a first layer 14 and a second layer 16 over the first layer 14. The acoustic wave device 2 can include a temperature compensation layer 18 over the interdigital transducer electrode 12. The acoustic wave device 2 can include a dispersion adjustment layer 20 over the temperature compensation layer 18.

Unlike the acoustic wave device 1 illustrated in FIGS. 1A and 1B, the second layer 16 of the interdigital transducer electrode 12 is disposed between the piezoelectric layer 10 and the first layer 14 in the acoustic wave device 2. In some embodiments, the thickness T1 of the first layer 14 and the thickness T2 of the second layer 16 can be the same or generally similar. In some other embodiments, the thickness T1 of the first layer 14 and the thickness T2 of the second layer 16 can be different. For example, the first thickness T1 can be 0.3 to 3, 0.3 to 2, 0.3 to 1, 0.5 to 3, or 0.5 to 1, times the second thickness T2.

Figure 3B:
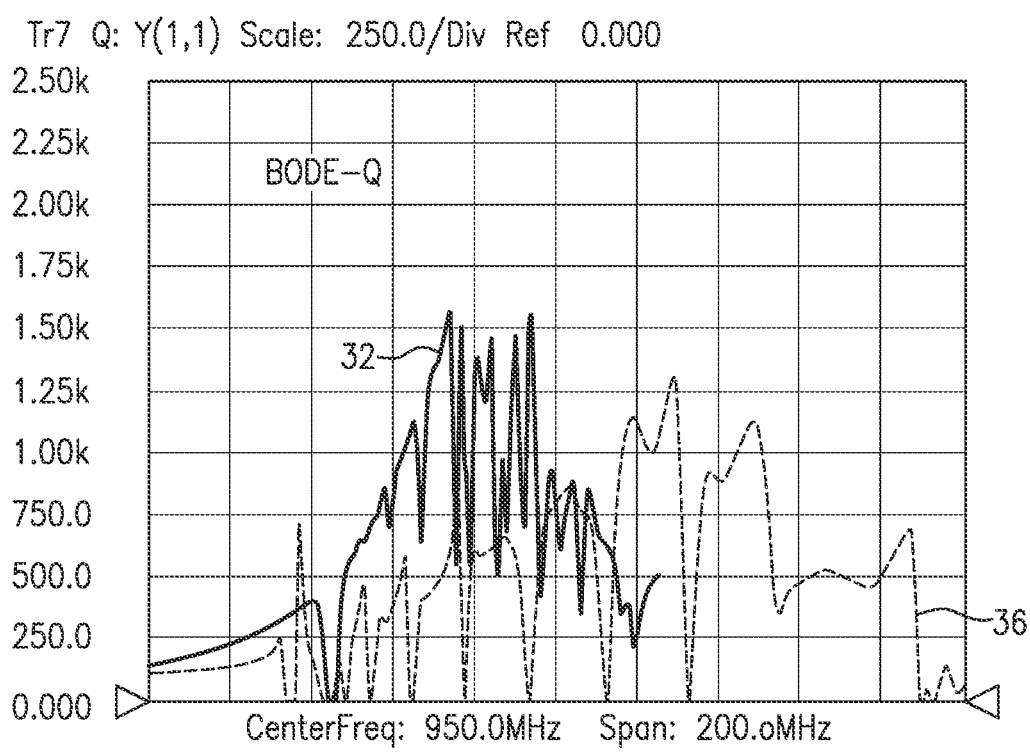

FIGS. 3A and 3B graphs showing simulated frequency responses of two different surface acoustic wave devices. The graph in FIG. 3A shows admittance and the graph in FIG. 3B shows bode plot. Simulation results 30, 32 are of a 128LN Rayleigh mode surface acoustic wave device and simulation results 34, 36 are of a −6LN shear horizontal mode surface acoustic wave device. The graphs of FIGS. 3A and 3B indicate that the −6LN shear horizontal mode surface acoustic wave device has a frequency response with a higher coupling factor $K^2$ than a coupling factor $K^2$ of the 128LN Rayleigh mode surface acoustic wave device. However, a quality factor Q of the −6LN shear horizontal mode surface acoustic wave device has a frequency response that is degraded as compared to a quality factor Q of the 128LN Rayleigh mode surface acoustic wave device. Various embodiments disclosed herein can enable a shear horizontal mode acoustic wave device to have an improved quality factor Q while maintaining a relatively high higher coupling factor $K^2$.

Figure 4A:
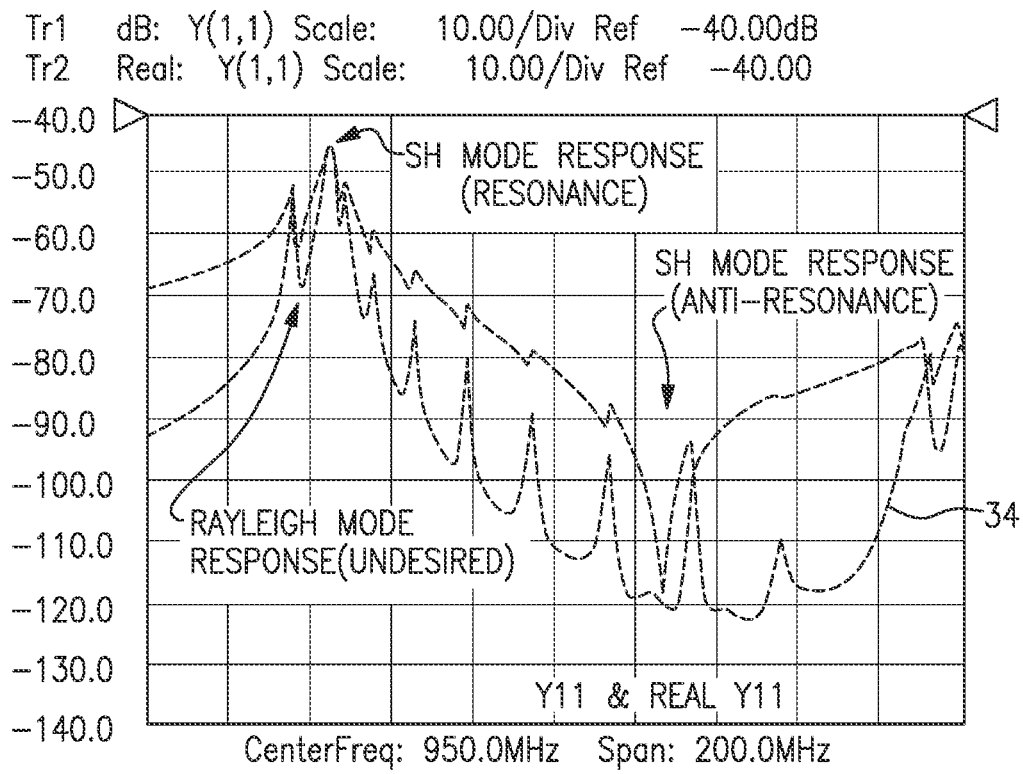
FIGS. 4A and 4B graphs showing simulated frequency responses of a −6LN shear horizontal mode surface acoustic wave device.
Figure 4B:
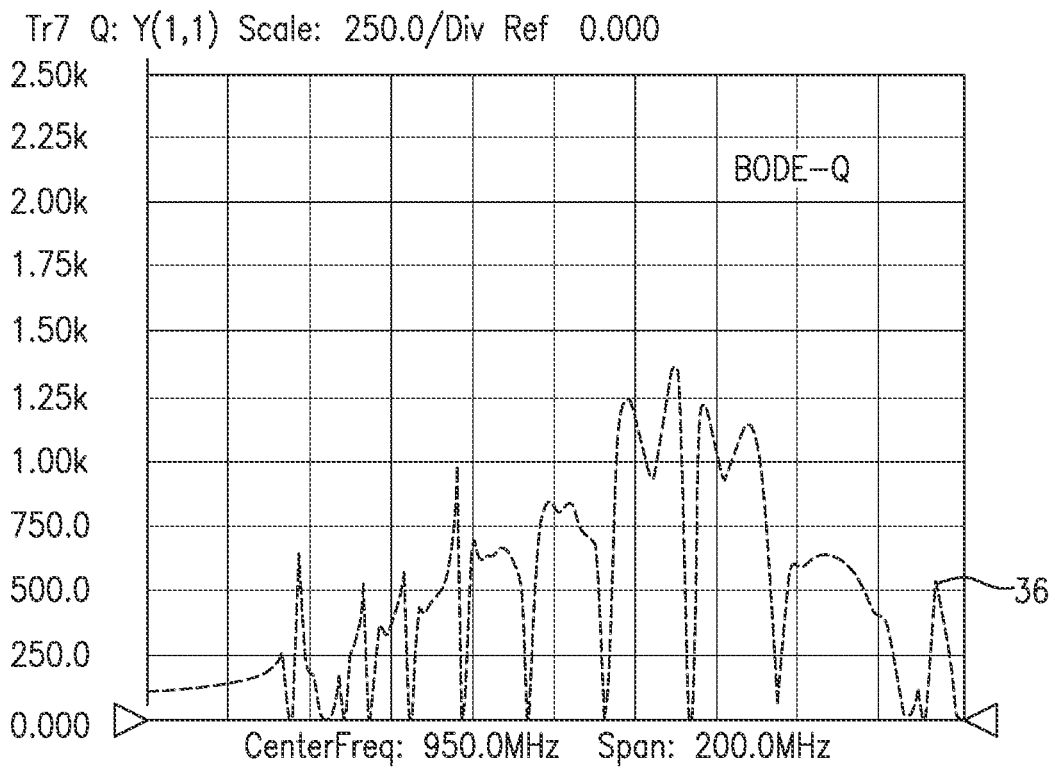
Figure 5A:
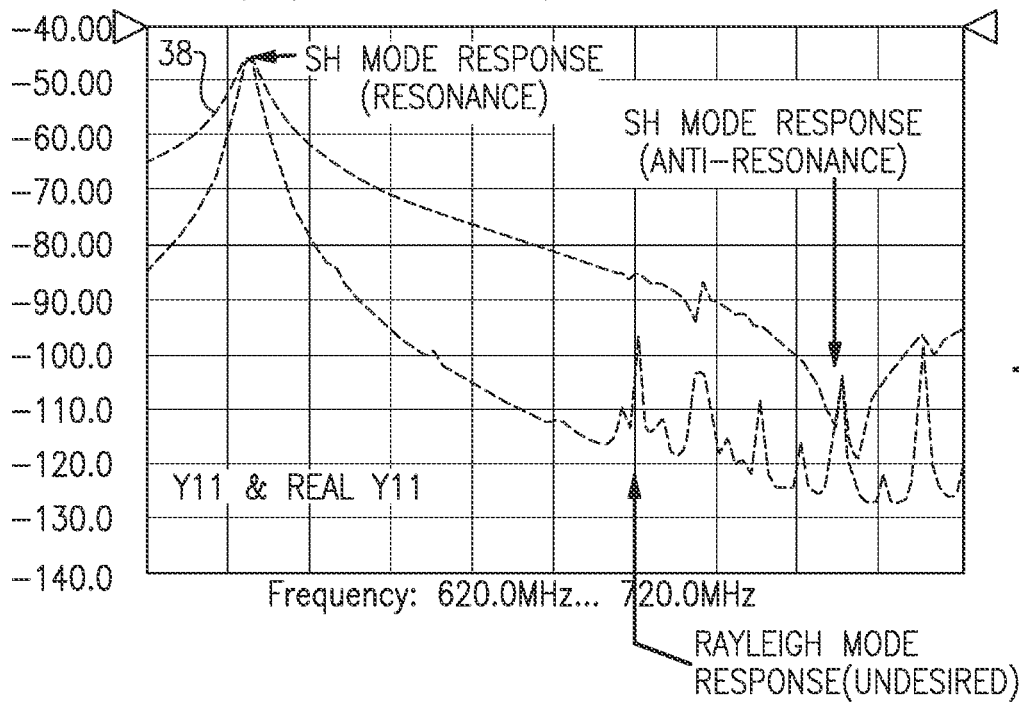
FIGS. 5A and 5B are graphs showing simulated frequency responses of the acoustic wave device of FIGS. 1A and 1B.
Figure 5B:
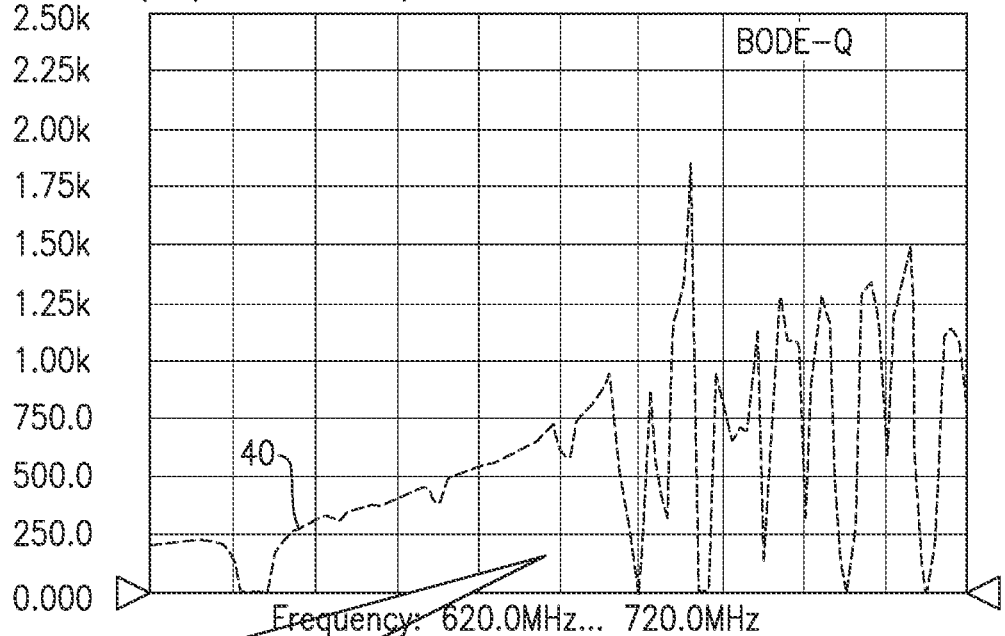

In FIGS. 4A and 4B, only the simulation results 34, 36 of the −6LN shear horizontal mode surface acoustic wave device are shown. FIGS. 5A and 5B are graphs showing simulated frequency responses of the acoustic wave device 1 illustrated in FIGS. 1A and 1B. The graphs in FIGS. 4A and 5A show admittance and the graphs in FIGS. 4B and 5B show bode plot. Simulation results 38, 40 of the acoustic wave device 1 shown in FIGS. 4A-5B indicate that a coupling factor $K^2$ of the frequency response of the acoustic wave device 1 is higher than the coupling factor $K^2$ of the 128LN Rayleigh mode surface acoustic wave device shown in FIGS. 3A and 3B, and a quality factor Q of the frequency response of the acoustic wave device 1 is improved relative to the quality factor Q of the −6LN shear horizontal mode surface acoustic wave device shown in FIGS. 4A and 4B.

FIGS. 4A and 5A also indicate that a surface acoustic wave velocity of Rayleigh surface acoustic wave resonance increases in the acoustic wave device 1 as compared to a surface acoustic wave velocity of Rayleigh surface acoustic wave resonance of the −6LN shear horizontal mode surface acoustic wave device. In some embodiments, the acoustic wave device 1 can be configured such that a frequency response of the acoustic wave device includes a Rayleigh mode response at a frequency higher than a shear horizontal mode response. For example, the Rayleigh mode response can be at a frequency between the shear horizontal mode response resonance and a shear horizontal mode anti-resonance, or higher than the shear horizontal mode anti-resonance.

Figure 6A:
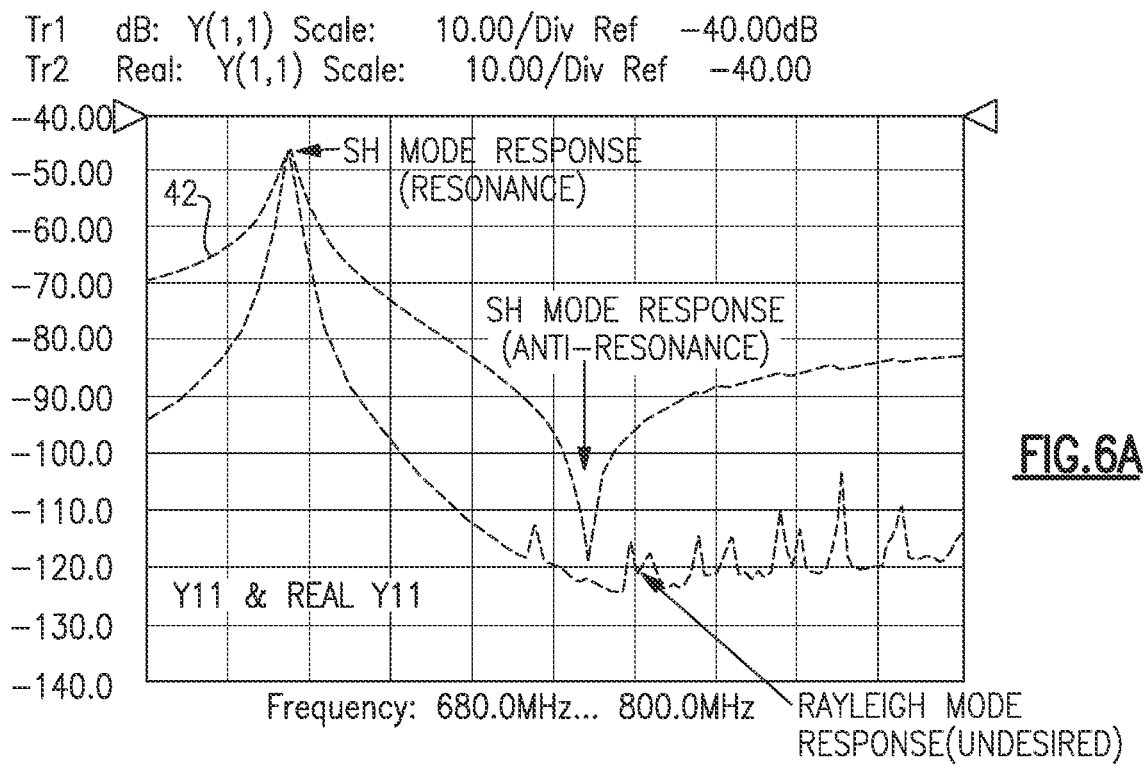
FIGS. 6A and 6B are graphs showing simulated frequency responses of the acoustic wave device of FIGS. 2A and 2B.
Figure 6B:
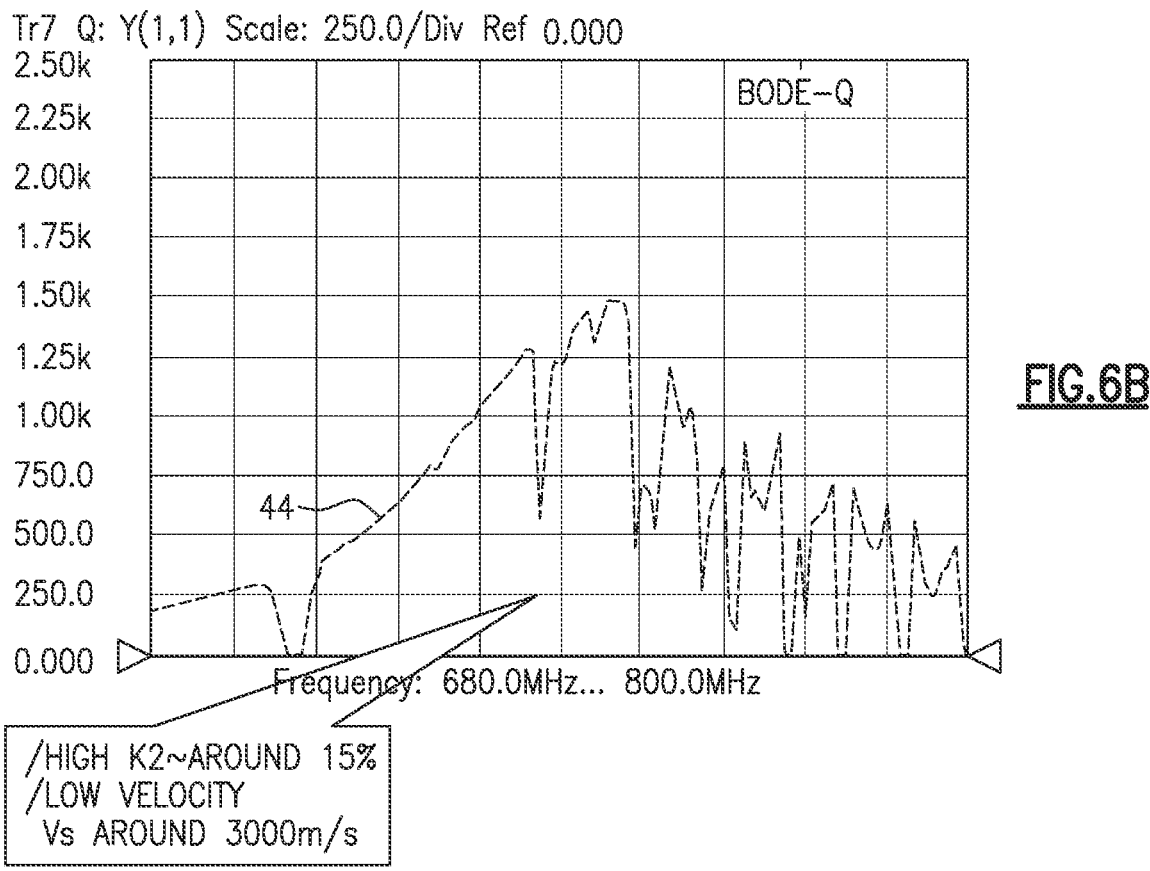

FIGS. 6A and 6B are graphs showing simulated frequency responses of the acoustic wave device 2 illustrated in FIGS. 2A and 2B. The graph in FIG. 6A shows admittance and the graph in FIG. 6B shows bode plot. Simulation results 42, 44 of the acoustic wave device 2 shown in FIGS. 6A and 6B indicate that a coupling factor $K^2$ of the frequency response of the acoustic wave device 2 is higher than the coupling factor $K^2$ of the 128LN Rayleigh mode surface acoustic wave device shown in FIGS. 3A and 3B, and a quality factor Q of the frequency response of the acoustic wave device 2 is improved relative to the quality factor Q of the −6LN shear horizontal mode surface acoustic wave device shown in FIGS. 4A and 4B.

FIG. 6A also indicates that a surface acoustic wave velocity of Rayleigh surface acoustic wave resonance increases in the acoustic wave device 2 as compared to a surface acoustic wave velocity of Rayleigh surface acoustic wave resonance of the −6LN shear horizontal mode surface acoustic wave device. In some embodiments, the acoustic wave device 2 can be configured such that a frequency response of the acoustic wave device 2 includes a Rayleigh mode response at a frequency higher than a shear horizontal mode response. For example, the Rayleigh mode response can be at a frequency between the shear horizontal mode response resonance and a shear horizontal mode anti-resonance, or higher than the shear horizontal mode anti-resonance.

Figure 7A:
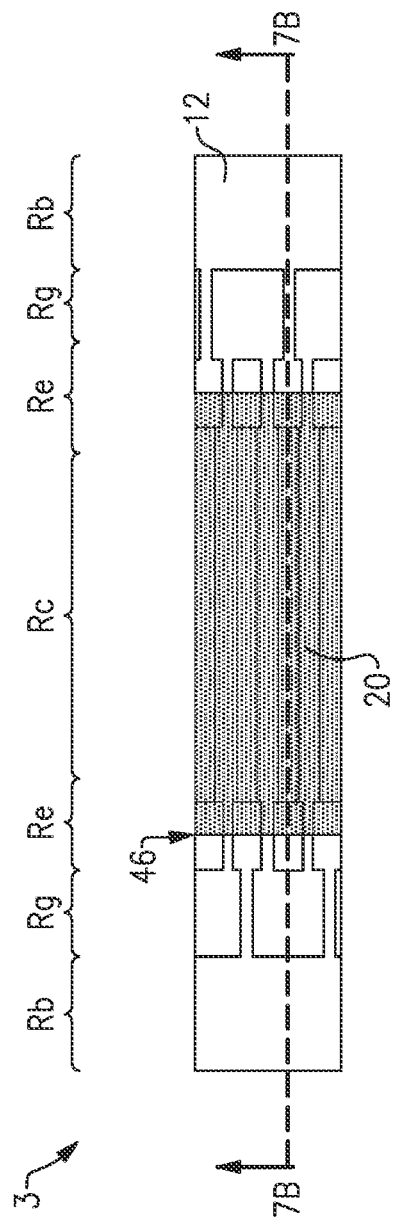
FIG. 7A is a schematic top plan view of an acoustic wave device according to another embodiment.
Figure 7B:
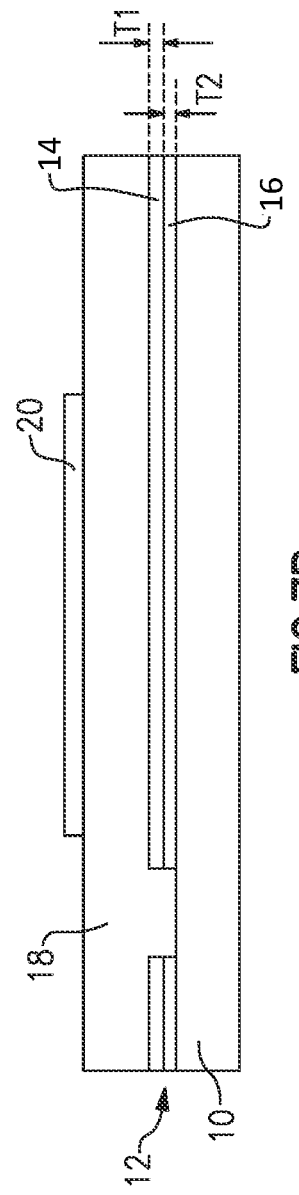
FIG. 7B is a schematic cross-sectional side view of the surface acoustic wave device of FIG. 7A.

FIG. 7A is a schematic top plan view of an acoustic wave device 3 according to an embodiment. FIG. 7B is a schematic cross-sectional side view of the surface acoustic wave device 3 of FIG. 7A. The acoustic wave device 3 can be generally similar to the acoustic wave device 2 illustrated in FIGS. 2A and 2B. Unless otherwise noted, the components of FIGS. 7A and 7B may be similar to or the same as like components disclosed herein, such as those of FIGS. 1A to 2B.

The acoustic wave device 3 can include a piezoelectric layer 10 and an interdigital transducer electrode 12 over the piezoelectric layer 10. The interdigital transducer electrode 12 can have a first layer 14 and a second layer 16 over the first layer 14. The acoustic wave device 2 can include a temperature compensation layer 18 over the interdigital transducer electrode 12. The acoustic wave device 3 can include a dispersion adjustment layer 20 over the temperature compensation layer 18.

Unlike the acoustic wave device 1 illustrated in FIGS. 1A and 1B, the edge region Re of the interdigital transducer electrode 12 includes a hammer head structure 46 in the acoustic wave device 2. The hammer head structure 46 can provide a velocity difference between the border region and a central part of the active region (e.g., between the edge region Re and the center region Rc), thereby facilitating the piston mode operation. Therefore, the hammer head structure 46 is an example of a piston mode structure.

Also, unlike the acoustic wave device 1 illustrated in FIGS. 1A and 1B, the dispersion adjustment layer 20 is disposed over the center region Rc as well as a portion of the edge region Rg. The portions uncovered by or free from the dispersion adjustment layer 20 can reduce velocity in the underlying region of the acoustic wave device 1 relative to regions covered by the dispersion adjustment layer 20 to thereby suppress transverse modes.

Further, unlike the acoustic wave device 1 illustrated in FIGS. 1A and 1B, fingers of the interdigital transducer electrode 12 in the acoustic wave device 3 have a narrower width in the edge region Re as compared to the fingers in the center region Rc. In some embodiments, the narrower width the edge region Re can contribute to the piston mode operation.

Figure 8A:
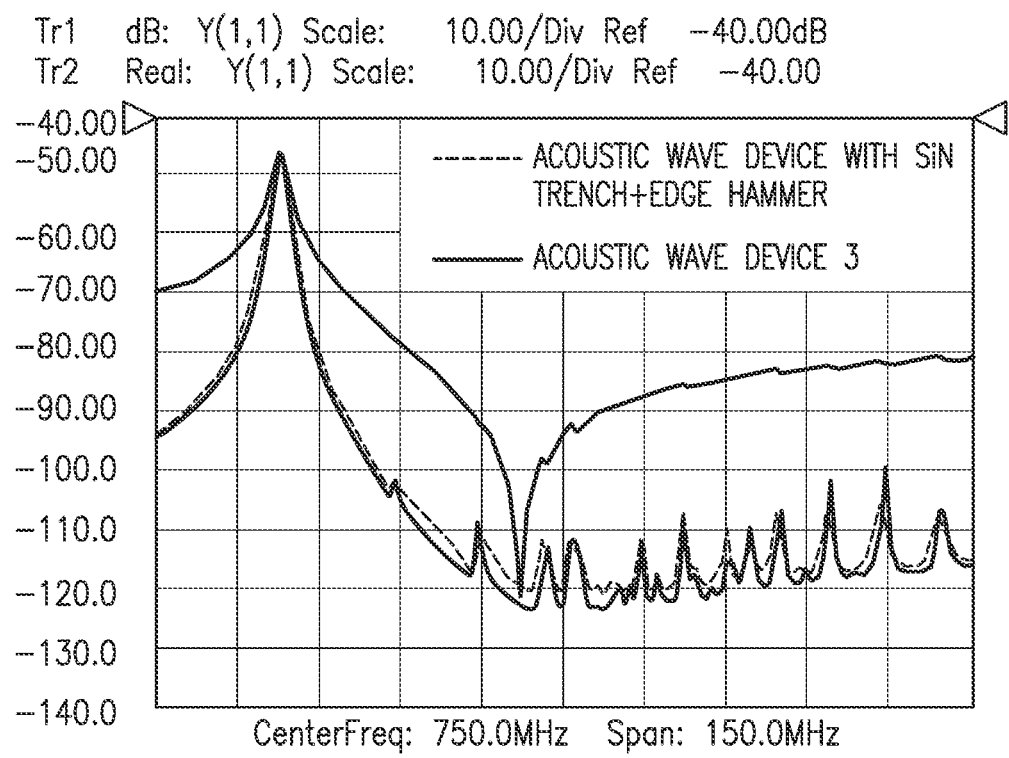
FIGS. 8A and 8B are graphs showing simulated frequency responses of two different acoustic wave devices.
Figure 8B:
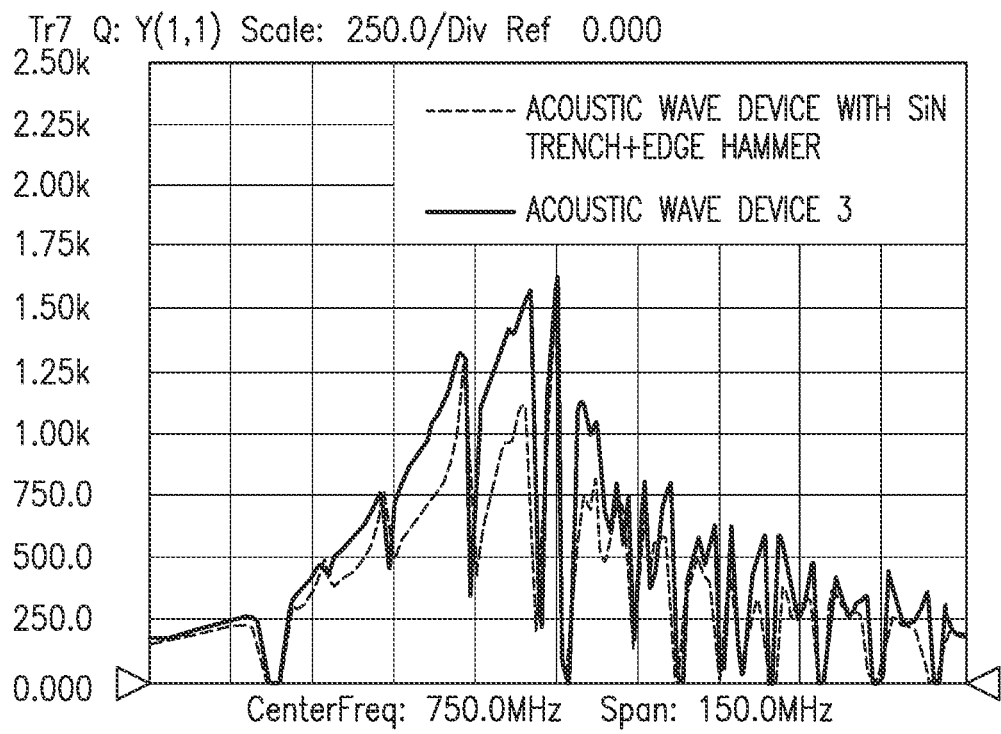

FIGS. 8A and 8B are graphs showing simulated frequency responses of two different acoustic wave devices. One of the acoustic wave devices used in the simulation includes the acoustic wave device 3 shown in FIGS. 7A and 7B. The other one of the acoustic wave devices used in the simulation includes a structure similar to the acoustic wave device 3 except that the fingers of the interdigital transducer electrode 12 in the acoustic wave device 3 the fingers in the edge region Re and the center region Rc have the same widths. The simulation results indicate that the narrower finger in the edge region Re as compared to the fingers in the center region Rc can improve the quality factor Q.

FIG. 9A is a schematic top plan view of an acoustic wave device 4 according to an embodiment. FIG. 9B is a schematic cross-sectional side view of the surface acoustic wave device 4 of FIG. 9A. Unless otherwise noted, the components of FIGS. 7A and 7B may be similar to or the same as like components disclosed herein, such as those of FIGS. 1A to 2B, 7A, and 7B. The acoustic wave device 4 can be generally similar to the acoustic wave device 1 illustrated in FIGS. 1A and 1B and the acoustic wave device 3 illustrated in FIGS. 7A and 7B. FIGS. 9A and 9B illustrate that the hammer head structure 46, the dispersion adjustment layer 20 over the center region Rc and a portion of the edge region Rg, and the narrower finger width illustrated in FIGS. 7A and 7B can be applied to the acoustic wave device 1 illustrated in FIGS. 1A and 1B.

FIG. 10A is a schematic top plan view of an acoustic wave device 5 according to an embodiment. FIG. 10B is a schematic cross-sectional side view of the surface acoustic wave device 5 of FIG. 10A. The acoustic wave device 5 can be generally similar to the acoustic wave device 3 illustrated in FIGS. 7A and 7B. Unless otherwise noted, the components of FIGS. 10A and 10B may be similar to or the same as like components disclosed herein, such as those of FIGS. 1A to 2B, 7A, 7B, 9A, and 9B.

The acoustic wave device 5 can include a piezoelectric layer 10 and an interdigital transducer electrode 12 over the piezoelectric layer 10. The interdigital transducer electrode 12 can have a first layer 14 and a second layer 16 over the first layer 14. The acoustic wave device 2 can include a temperature compensation layer 18 over the interdigital transducer electrode 12. The acoustic wave device 3 can include a dispersion adjustment layer 20 over the temperature compensation layer 18.

Unlike the acoustic wave device 3 illustrated in FIGS. 7A and 7B, the interdigital transducer electrode 12 of the acoustic wave device 5 includes dummy fingers 48 in the gap region Rg that extends from the bus bar. The dummy fingers 48 are shorter than the fingers of the interdigital transducer electrode 12. The dummy fingers 48 can function as pseudo-electrodes for mitigating or preventing interference with the propagation of a wave generated by the fingers of the interdigital transducer electrode 12.

FIG. 11A is a schematic top plan view of an acoustic wave device 6 according to an embodiment. FIG. 11B is a schematic cross-sectional side view of the surface acoustic wave device 6 of FIG. 11A. The acoustic wave device 6 can be generally similar to the acoustic wave device 5 illustrated in FIGS. 10A and 10B. Unless otherwise noted, the components of FIGS. 11A and 11B may be similar to or the same as like components disclosed herein, such as those of FIGS. 1A to 2B, 7A, 7B, and 9A to 10B.

Unlike the acoustic wave device 5 illustrated in FIGS. 10A and 10B, fingers and the dummy fingers 48 of the interdigital transducer electrode 12 in the acoustic wave device 5 have narrower widths in the edge region Re as compared to the fingers in the center region Rc.

Figure 12A:
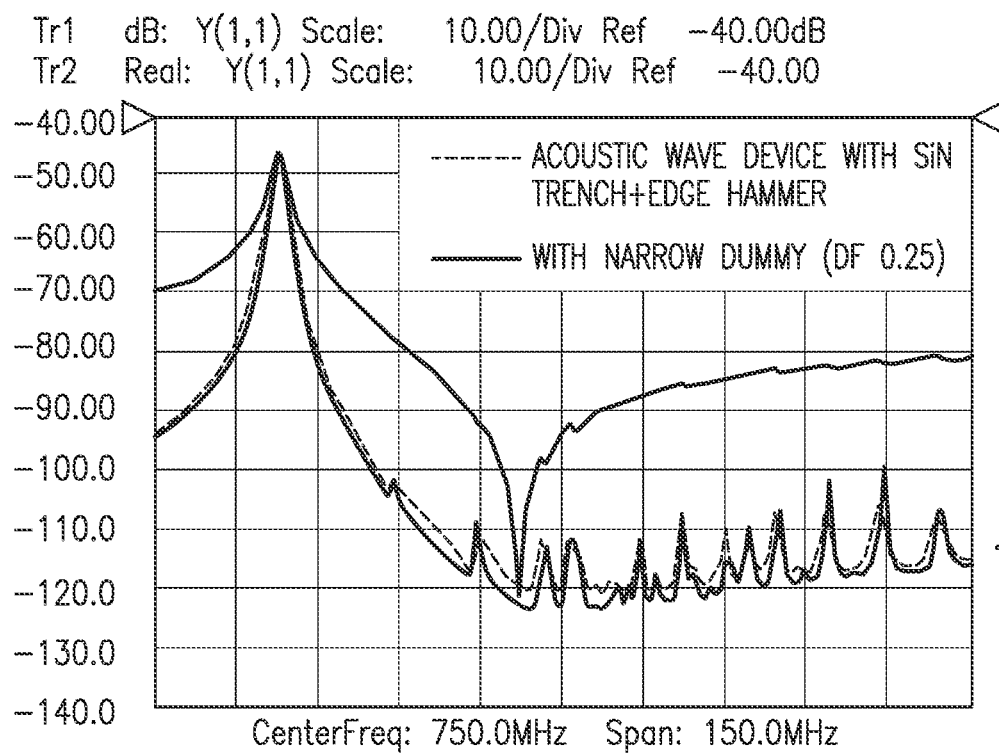
FIGS. 12A and 12B are graphs showing simulated frequency responses of two different acoustic wave devices.
Figure 12B:
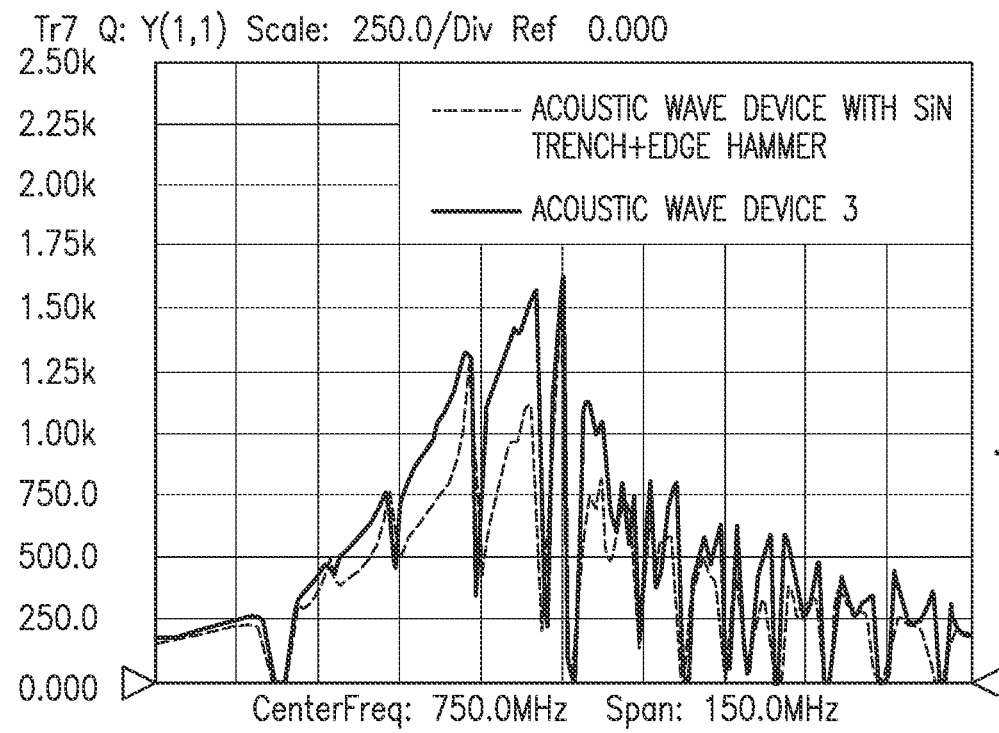

FIGS. 12A and 12B are graphs showing simulated frequency responses of two different acoustic wave devices. One of the acoustic wave devices used in the simulation includes the acoustic wave device 6 shown in FIGS. 11A and 11B. The other one of the acoustic wave devices used in the simulation includes a structure similar to the acoustic wave device 3 shown in FIGS. 7A and 7B except that the fingers of the interdigital transducer electrode 12 in the gap region Rg and the center region Rc have the same widths. The simulation results indicate that the narrower fingers and dummy fingers 48 in the edge region Re as compared to the fingers in the center region Rc can improve the quality factor Q.

Any suitable principles and advantages disclosed herein can be implemented in a variety of acoustic devices. For example, any suitable principles and advantages disclosed herein can be applied to multilayer piezoelectric surface acoustic wave devices, non-temperature compensated surface acoustic wave devices that does not include a temperature compensation layer over an interdigital transducer electrode, Lamb wave resonators, shear horizontal mode acoustic wave device, or any acoustic wave devices that include an interdigital transducer electrode over a piezoelectric layer.

Figure 13A:
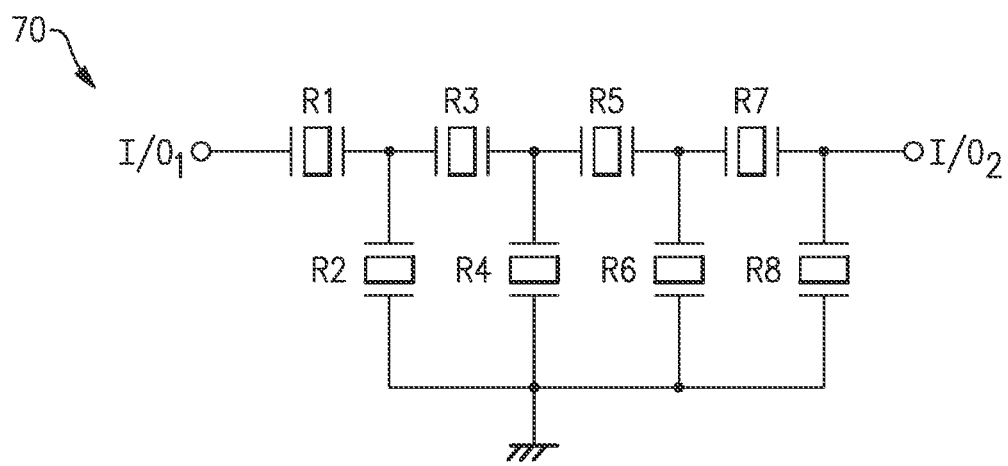
FIG. 13A is a schematic diagram of a ladder filter that includes an acoustic wave resonator according to an embodiment.

FIG. 13A is a schematic diagram of a ladder filter 70 that includes an acoustic wave resonator according to an embodiment. The ladder filter 70 is an example topology that can implement a band pass filter formed from acoustic wave resonators. In a band pass filter with a ladder filter topology, the shunt resonators can have lower resonant frequencies than the series resonators. The ladder filter 70 can be arranged to filter a radio frequency signal. As illustrated, the ladder filter 70 includes series acoustic wave resonators R1, R3, R5, and R7 and shunt acoustic wave resonators R2, R4, R6, and R8 coupled between a first input/output port I/O$_1$ and a second input/output port I/O$_2$. Any suitable number of series acoustic wave resonators can be in included in a ladder filter. Any suitable number of shunt acoustic wave resonators can be included in a ladder filter. The first input/output port I/O$_1$ can a transmit port and the second input/output port I/O$_2$ can be an antenna port. Alternatively, first input/output port I/O$_1$ can be a receive port and the second input/output port I/O$_2$ can be an antenna port.

Figure 13B:
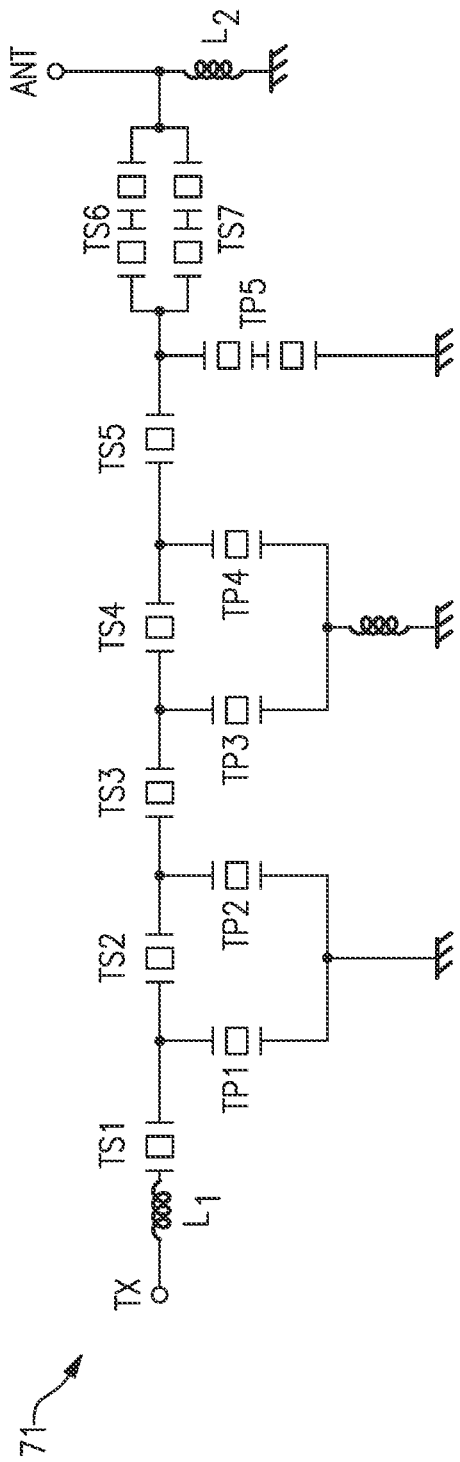
FIG. 13B is a schematic diagram of a transmit filter that includes a surface acoustic wave resonator according to an embodiment.

FIG. 13B is a schematic diagram of an example transmit filter 71 that includes surface acoustic wave resonators of a surface acoustic wave component according to an embodiment. The transmit filter 71 can be a band pass filter. The illustrated transmit filter 71 is arranged to filter a radio frequency signal received at a transmit port TX and provide a filtered output signal to an antenna port ANT. The transmit filter 71 includes series SAW resonators TS1, TS2, TS3, TS4, TS5, TS6, and TS7, shunt SAW resonators TP1, TP2, TP3, TP4, and TP5, series input inductor L1, and shunt inductor L2. Some or all of the SAW resonators TS1, TS2, TS3, TS4, TS5, TS6, and TS7 and/or TP1, TP2, TP3, TP4, and TP5 can be a SAW resonators with a conductive strip for transverse mode suppression in accordance with any suitable principles and advantages disclosed herein. For instance, one or more of the SAW resonators of the transmit filter 71 can be any surface acoustic wave resonator disclosed herein. Any suitable number of series SAW resonators and shunt SAW resonators can be included in a transmit filter 71.

Figure 13C:
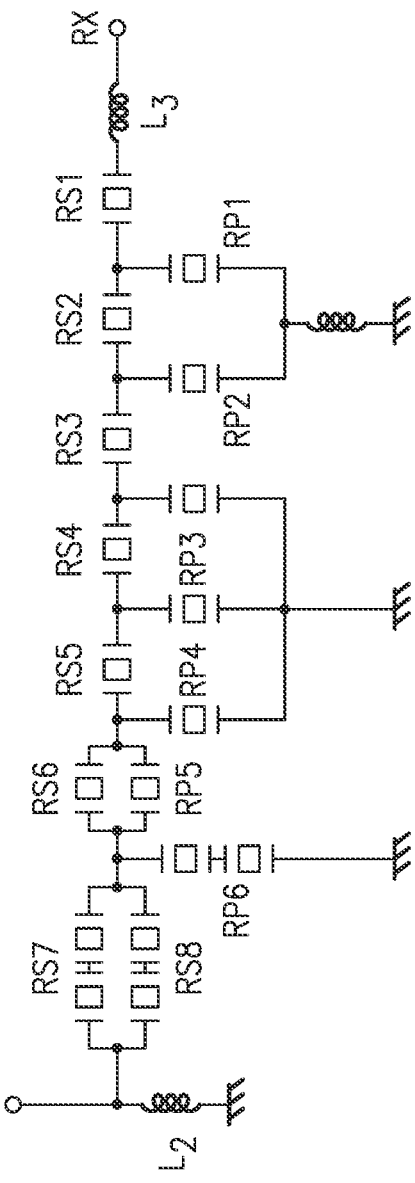
FIG. 13C is a schematic diagram of a receive filter that includes a surface acoustic wave resonator according to an embodiment.

FIG. 13C is a schematic diagram of a receive filter 72 that includes surface acoustic wave resonators of a surface acoustic wave component according to an embodiment. The receive filter 72 can be a band pass filter. The illustrated receive filter 72 is arranged to filter a radio frequency signal received at an antenna port ANT and provide a filtered output signal to a receive port RX. The receive filter 72 includes series SAW resonators RS1, RS2, RS3, RS4, RS5, RS6, RS7, and RS7, shunt SAW resonators RP1, RP2, RP3, RP4, and RP5, and RP6, shunt inductor L2, and series output inductor L3. Some or all of the SAW resonators RS1, RS2, RS3, RS4, RS5, RS6, RS7, and RS8 and/or RP1, RP2, RP3, RP4, RP5, and RP6 can be SAW resonators with a conductive strip for transverse mode suppression in accordance with any suitable principles and advantages disclosed herein. For instance, one or more of the SAW resonators of the receive filter 72 can be any surface acoustic wave resonator disclosed herein. Any suitable number of series SAW resonators and shunt SAW resonators can be included in a receive filter 72.

Figure 14:
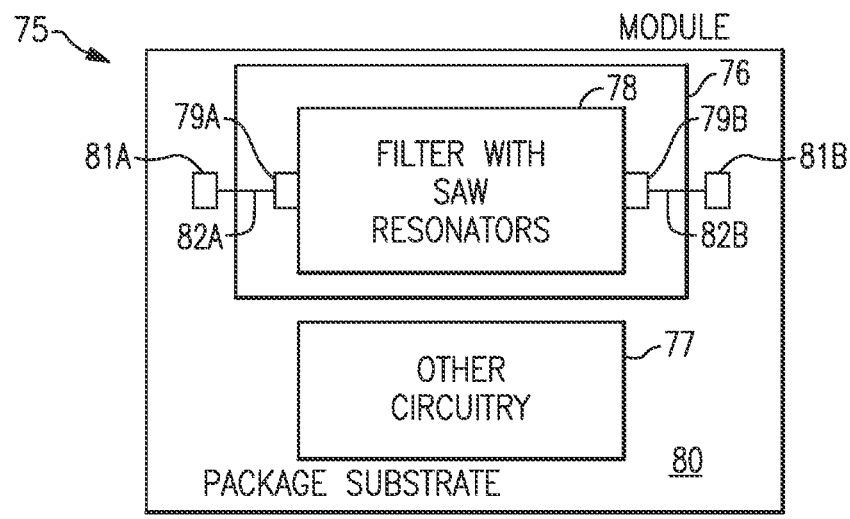
FIG. 14 is a schematic diagram of a radio frequency module that includes a surface acoustic wave component according to an embodiment.

FIG. 14 is a schematic diagram of a radio frequency module 75 that includes a surface acoustic wave component 76 according to an embodiment. The illustrated radio frequency module 75 includes the SAW component 76 and other circuitry 77. The SAW component 76 can include one or more SAW resonators with any suitable combination of features of the SAW resonators and/or acoustic wave devices disclosed herein. The SAW component 76 can include a SAW die that includes SAW resonators.

The SAW component 76 shown in FIG. 14 includes a filter 78 and terminals 79A and 79B. The filter 78 includes SAW resonators. One or more of the SAW resonators can be implemented in accordance with any suitable principles and advantages of any surface acoustic wave resonator disclosed herein. The filter 78 can be a TC-SAW filter arranged as a band pass filter to filter radio frequency signals with frequencies below about 3.5 GHz in certain applications. The terminals 79A and 78B can serve, for example, as an input contact and an output contact. The SAW component 76 and the other circuitry 77 are on a common packaging substrate 80 in FIG. 14. The packaging substrate 80 can be a laminate substrate. The terminals 79A and 79B can be electrically connected to contacts 81A and 81B, respectively, on the packaging substrate 80 by way of electrical connectors 82A and 82B, respectively. The electrical connectors 82A and 82B can be bumps or wire bonds, for example. The other circuitry 77 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 75 can include one or more packaging structures to, for example, provide protection and/or facilitate easier handling of the radio frequency module 75. Such a packaging structure can include an overmold structure formed over the packaging substrate 80. The overmold structure can encapsulate some or all of the components of the radio frequency module 75.

Figure 15:
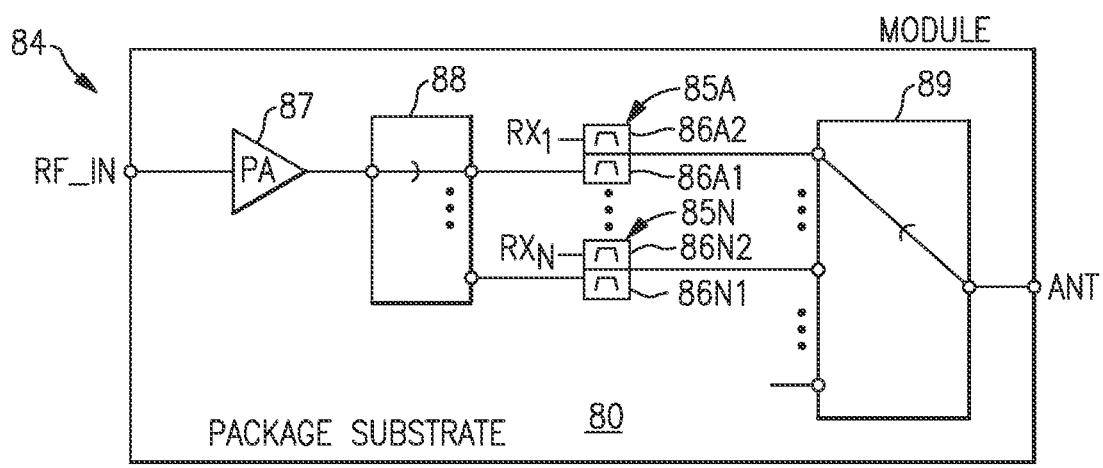
FIG. 15 is a schematic diagram of a radio frequency module that includes filters with surface acoustic wave resonators according to an embodiment.

FIG. 15 is a schematic diagram of a radio frequency module 84 that includes a surface acoustic wave component according to an embodiment. As illustrated, the radio frequency module 84 includes duplexers 85A to 85N that include respective transmit filters 86A1 to 86N1 and respective receive filters 86A2 to 86N2, a power amplifier 87, a select switch 88, and an antenna switch 89. The radio frequency module 84 can include a package that encloses the illustrated elements. The illustrated elements can be disposed on a common packaging substrate 80. The packaging substrate can be a laminate substrate, for example.

The duplexers 85A to 85N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 86A1 to 86N1 can include one or more SAW resonators in accordance with any suitable principles and advantages disclosed herein. Similarly, one or more of the receive filters 86A2 to 86N2 can include one or more SAW resonators in accordance with any suitable principles and advantages disclosed herein. Although FIG. 15 illustrates duplexers, any suitable principles and advantages disclosed herein can be implemented in other multiplexers (e.g., quadplexers, hexaplexers, octoplexers, etc.) and/or in switch-plexers.

The power amplifier 87 can amplify a radio frequency signal. The illustrated switch 88 is a multi-throw radio frequency switch. The switch 88 can electrically couple an output of the power amplifier 87 to a selected transmit filter of the transmit filters 86A1 to 86N1. In some instances, the switch 88 can electrically connect the output of the power amplifier 87 to more than one of the transmit filters 86A1 to 86N1. The antenna switch 89 can selectively couple a signal from one or more of the duplexers 85A to 85N to an antenna port ANT. The duplexers 85A to 85N can be associated with different frequency bands and/or different modes of operation (e.g., different power modes, different signaling modes, etc.).

Figure 16A:
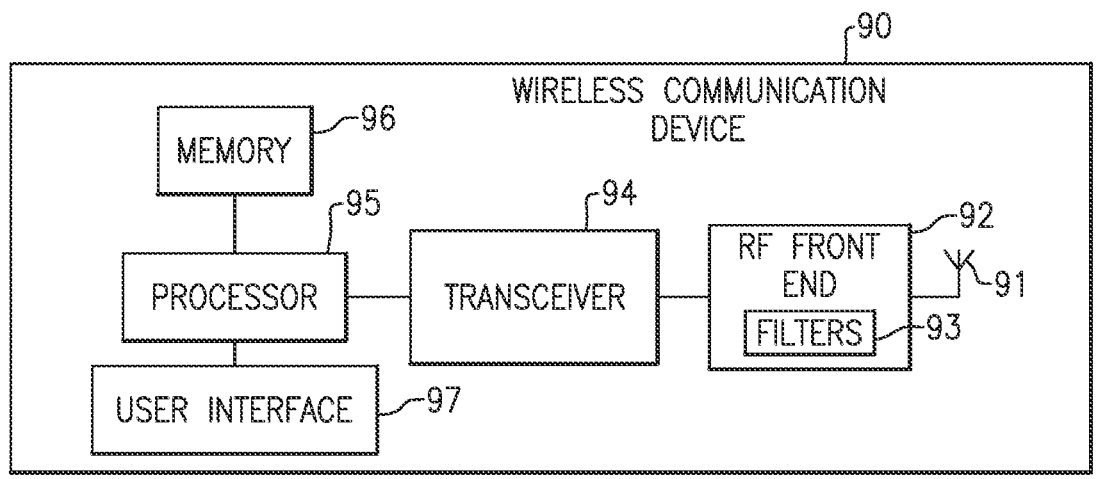
FIG. 16A is a schematic block diagram of a wireless communication device that includes a filter in accordance with one or more embodiments.

FIG. 16A is a schematic diagram of a wireless communication device 90 that includes filters 93 in a radio frequency front end 92 according to an embodiment. The filters 93 can include one or more SAW resonators in accordance with any suitable principles and advantages discussed herein. The wireless communication device 90 can be any suitable wireless communication device. For instance, a wireless communication device 90 can be a mobile phone, such as a smart phone. As illustrated, the wireless communication device 90 includes an antenna 91, an RF front end 92, a transceiver 94, a processor 95, a memory 96, and a user interface 97. The antenna 91 can transmit RF signals provided by the RF front end 92. Such RF signals can include carrier aggregation signals. Although not illustrated, the wireless communication device 90 can include a microphone and a speaker in certain applications.

The RF front end 92 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 92 can transmit and receive RF signals associated with any suitable communication standards. The filters 93 can include SAW resonators of a SAW component that includes any suitable combination of features discussed with reference to any embodiments discussed above.

The transceiver 94 can provide RF signals to the RF front end 92 for amplification and/or other processing. The transceiver 94 can also process an RF signal provided by a low noise amplifier of the RF front end 92. The transceiver 94 is in communication with the processor 95. The processor 95 can be a baseband processor. The processor 95 can provide any suitable base band processing functions for the wireless communication device 90. The memory 96 can be accessed by the processor 95. The memory 96 can store any suitable data for the wireless communication device 90. The user interface 97 can be any suitable user interface, such as a display with touch screen capabilities.

Figure 16B:
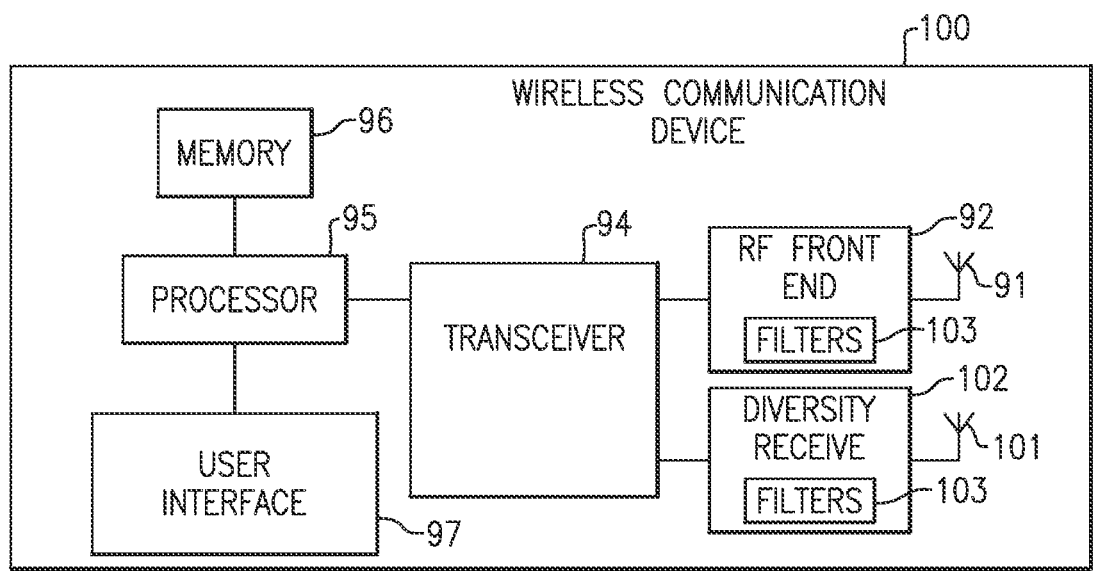
FIG. 16B is a schematic block diagram of another wireless communication device that includes a filter in accordance with one or more embodiments.

FIG. 16B is a schematic diagram of a wireless communication device 100 that includes filters 93 in a radio frequency front end 92 and a second filter 103 in a diversity receive module 102. The wireless communication device 100 is like the wireless communication device 90 of FIG. 161A, except that the wireless communication device 100 also includes diversity receive features. As illustrated in FIG. 16B, the wireless communication device 100 includes a diversity antenna 101, a diversity module 102 configured to process signals received by the diversity antenna 101 and including filters 103, and a transceiver 104 in communication with both the radio frequency front end 92 and the diversity receive module 102. The filters 103 can include one or more SAW resonators that include any suitable combination of features discussed with reference to any embodiments discussed above.

Figure 17:
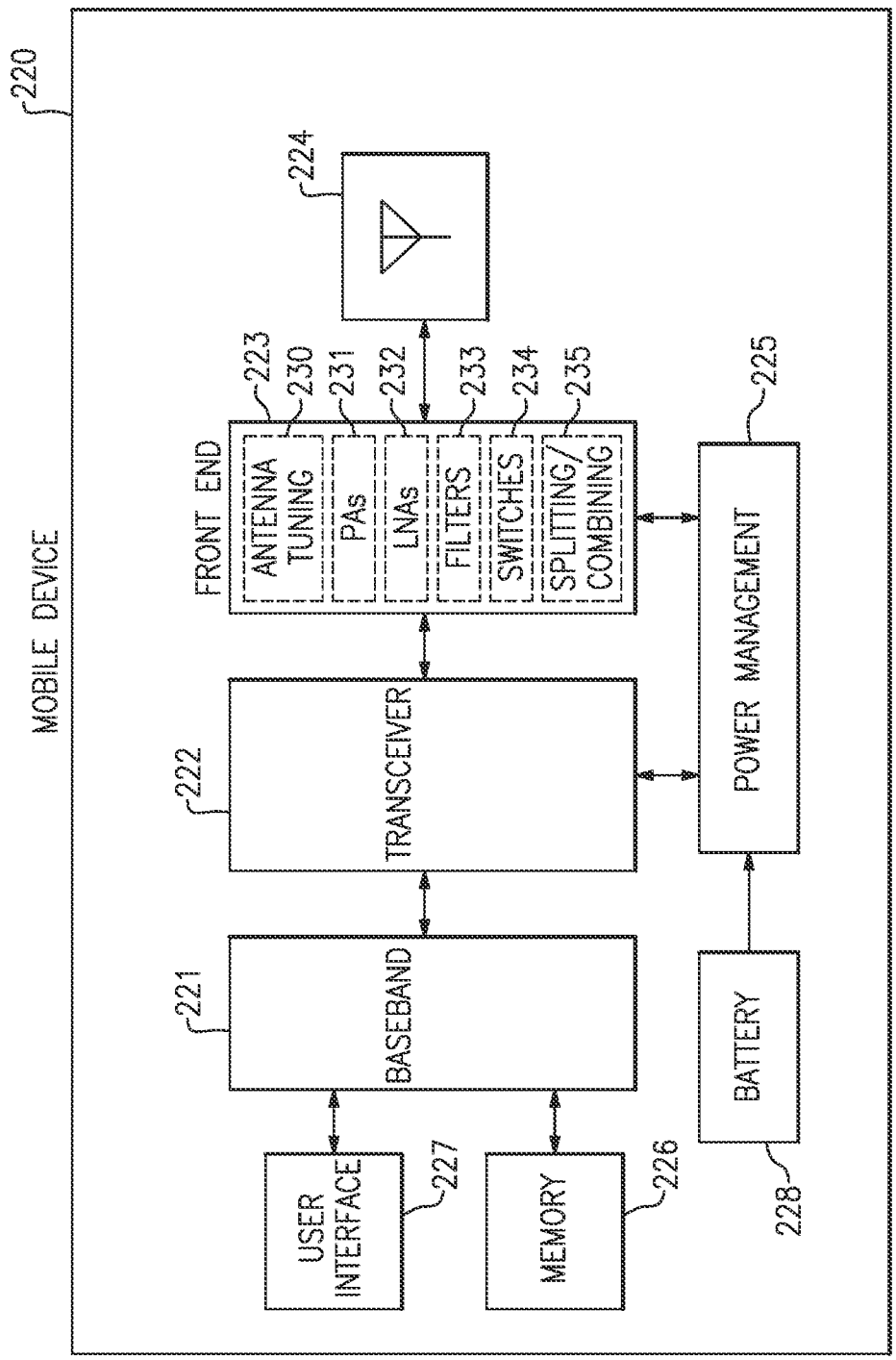
FIG. 17 is a schematic block diagram of a wireless communication device that includes a filter according to an embodiment.

FIG. 17 is a schematic block diagram of a wireless communication device 220 that includes a filter according to an embodiment. The wireless communication device 220 can be a mobile device. The wireless communication device 220 can be any suitable wireless communication device. For instance, a wireless communication device 220 can be a mobile phone, such as a smart phone. As illustrated, the wireless communication device 220 includes a baseband system 221, a transceiver 222, a front end system 223, one or more antennas 224, a power management system 225, a memory 226, a user interface 227, and a battery 228.

The wireless communication device 220 can be used communicate using a wide variety of communications technologies, including, but not limited to, 2G, 3G, 4G (including LTE, LTE-Advanced, and/or LTE-Advanced Pro), 5G NR, WLAN (for instance, Wi-Fi), WPAN (for instance, Bluetooth and/or ZigBee), WMAN (for instance, WiMax), and/or GPS technologies.

The transceiver 222 generates RF signals for transmission and processes incoming RF signals received from the antennas 224. Various functionalities associated with the transmission and receiving of RF signals can be achieved by one or more components that are collectively represented in FIG. 17 as the transceiver 222. In one example, separate components (for instance, separate circuits or dies) can be provided for handling certain types of RF signals.

The front end system 223 aids in conditioning signals provided to and/or received from the antennas 224. In the illustrated embodiment, the front end system 223 includes antenna tuning circuitry 230, power amplifiers (PAs) 231, low noise amplifiers (LNAs) 232, filters 233, switches 234, and signal splitting/combining circuitry 235. However, other implementations are possible. The filters 233 can include one or more acoustic wave filters that include any suitable number of bulk acoustic wave devices in accordance with any suitable principles and advantages disclosed herein.

For example, the front end system 223 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 220 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 224 can include antennas used for a wide variety of types of communications. For example, the antennas 224 can include antennas for transmitting and/or receiving signals associated with a wide variety of frequencies and communications standards.

In certain implementations, the antennas 224 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 220 can operate with beamforming in certain implementations. For example, the front end system 223 can include amplifiers having controllable gain and phase shifters having controllable phase to provide beam formation and directivity for transmission and/or reception of signals using the antennas 224. For example, in the context of signal transmission, the amplitude and phases of the transmit signals provided to the antennas 224 are controlled such that radiated signals from the antennas 224 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 224 from a particular direction. In certain implementations, the antennas 224 include one or more arrays of antenna elements to enhance beamforming.

The baseband system 221 is coupled to the user interface 227 to facilitate processing of various user input and output (I/O), such as voice and data. The baseband system 221 provides the transceiver 222 with digital representations of transmit signals, which the transceiver 222 processes to generate RF signals for transmission. The baseband system 221 also processes digital representations of received signals provided by the transceiver 222. As shown in FIG. 17, the baseband system 221 is coupled to the memory 226 of facilitate operation of the wireless communication device 220.

The memory 226 can be used for a wide variety of purposes, such as storing data and/or instructions to facilitate the operation of the wireless communication device 220 and/or to provide storage of user information.

The power management system 225 provides a number of power management functions of the wireless communication device 220. In certain implementations, the power management system 225 includes a PA supply control circuit that controls the supply voltages of the power amplifiers 231. For example, the power management system 225 can be configured to change the supply voltage(s) provided to one or more of the power amplifiers 231 to improve efficiency, such as power added efficiency (PAE).

As shown in FIG. 17, the power management system 225 receives a battery voltage from the battery 228. The battery 228 can be any suitable battery for use in the wireless communication device 220, including, for example, a lithium-ion battery.

Any suitable principles and advantages of the surface acoustic wave devices disclosed herein can be implemented with one or more temperature compensated SAW resonators. Temperature compensated SAW resonators include a temperature compensation layer (e.g., a silicon dioxide layer) over an interdigital transducer electrode to bring a temperature coefficient of frequency closer to zero.

Packaged surface acoustic wave devices disclosed herein can include one or more surface acoustic wave resonators included in a filter arranged to filter a radio frequency signal in a fourth generation (4G) Long Term Evolution (LTE) operating band. Packaged surface acoustic wave devices disclosed herein can include one or more surface acoustic wave resonators included in a filter arranged to filter a radio frequency signal in a fifth generation (5G) New Radio (NR) operating band within Frequency Range 1 (FR1). FR1 can be from 410 megahertz (MHz) to 7.125 gigahertz (GHz), for example, as specified in a current 5G NR specification. Packaged surface acoustic wave devices disclosed herein can include one or more surface acoustic wave resonators included in a filter with a passband corresponding to both a 4G LTE operating band and a 5G NR operating band within FR1.

Any of the embodiments disclosed herein can combined. Any of the embodiments described above can be implemented in association with a radio frequency system and/or mobile devices such as cellular handsets. The principles and advantages of the embodiments can be used for any systems or apparatus that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz, a frequency range from about 450 MHz to 2.5 GHz, or a frequency range from about 450 MHz to 3 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, a peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
    a piezoelectric layer configured such that a shear horizontal mode is a main mode of the acoustic wave device;
    an interdigital transducer electrode over the piezoelectric layer, the interdigital transducer electrode including a first layer and a second layer, the first layer affecting acoustic properties of the acoustic wave device and the second layer affecting electrical properties of the acoustic wave device, the second layer positioned between the piezoelectric layer and the first layer such that a frequency response of the acoustic wave device includes a Rayleigh mode response at a frequency higher than a shear horizontal mode response; and
    a temperature compensation layer over the interdigital transducer electrode.

2. The acoustic wave device of claim 1 wherein the interdigital transducer electrode is configured such that the frequency response includes the Rayleigh mode response between a shear horizontal mode response resonance and a shear horizontal mode response anti-resonance.

3. The acoustic wave device of claim 1 wherein the interdigital transducer electrode is configured to suppress transverse leakage of a surface acoustic wave generated by the acoustic wave device.

4. The acoustic wave device of claim 1 wherein the first layer includes tungsten, molybdenum, platinum, iridium, gold, or copper, and the second layer includes aluminum.

5. The acoustic wave device of claim 1 wherein a first thickness of the first layer is greater than a second thickness of the second layer.

6. The acoustic wave device of claim 5 wherein the acoustic wave device is configured to generate a surface acoustic wave having a wavelength $\lambda$, the first thickness is in a range of $0.02\lambda$ to $0.1\lambda$.

7. The acoustic wave device of claim 1 wherein the interdigital transducer electrode further comprising a third layer between the piezoelectric layer and the first layer.

8. The acoustic wave device of claim 7 wherein the third layer is a titanium adhesion layer.

9. The acoustic wave device of claim 1 wherein the temperature compensation layer is a silicon dioxide layer.

10. The acoustic wave device of claim 1 further comprising a silicon nitride layer over the temperature compensation layer.

11. The acoustic wave device of claim 10 wherein the interdigital transducer electrode includes a bus bar region, an active region that includes a center region and an edge region, and a gap region between the bus bar region and the edge region, the silicon nitride layer is disposed over the center region of the interdigital transducer electrode and at least a portion of the edge region of the interdigital transducer electrode, portions of the temperature compensation layer over the edge region and the bus bar region are uncovered by the silicon nitride layer.

12. The acoustic wave device of claim 1 further comprising a piston mode structure configured to suppress a transverse mode of an acoustic wave generated by the acoustic wave device.

13. The acoustic wave device of claim 12 wherein the interdigital transducer electrode further comprises a hammer head structure.

14. The acoustic wave device of claim 1 wherein the interdigital transducer electrode further comprises a dummy finger disposed in a gap region between a bus bar and an active region.

15. The acoustic wave device of claim 14 wherein a width of a finger of the interdigital transducer electrode in the gap region and a width of the dummy finger are narrower than a width of the finger in the active region.

16. The acoustic wave device of claim 1 wherein the piezoelectric layer is a lithium niobate layer having a cut angle in a range of −20° YX to 25° YX.

17. A shear horizontal acoustic wave device comprising:
a piezoelectric layer having a cut angle in a range of −20° YX to 25° YX;
an interdigital transducer electrode over the piezoelectric layer, the interdigital transducer electrode including a first layer having a first density and a second layer having a second density, the first density being greater than the second density, the second layer positioned between the piezoelectric layer and the first layer such that a frequency response of the acoustic wave device includes a Rayleigh mode response at a frequency higher than a shear horizontal mode response; and
a temperature compensation layer over the interdigital transducer electrode.

18. The shear horizontal acoustic wave device of claim 17 wherein the piezoelectric layer is a lithium niobate layer and configured such that the shear horizontal mode response is a main mode of the acoustic wave device, and materials of the first layer and the second layer are configured such that a frequency response of the acoustic wave device includes the Rayleigh mode response at a frequency higher than a shear horizontal mode response resonance.

19. An acoustic wave device comprising:
a lithium niobate piezoelectric layer having a cut angle in a range of −20° YX to 25° YX such that a shear horizontal mode is a main mode of the acoustic wave device;
an interdigital transducer electrode over the piezoelectric layer, the interdigital transducer electrode including a tungsten layer and an aluminum layer, the aluminum layer positioned between the lithium niobate piezoelectric layer and the tungsten layer such that a frequency response of the acoustic wave device includes a Rayleigh mode response at a frequency higher than a shear horizontal mode response; and
a temperature compensation layer over the interdigital transducer electrode.

20. The acoustic wave device of claim 19 wherein the acoustic wave device is configured to generate a surface acoustic wave having a wavelength $\lambda$, a thickness of the tungsten layer is in a range of $0.02\lambda$ to $0.1\lambda$.

* * * * *